United States Patent
Tsuyuno et al.

(10) Patent No.: US 7,298,039 B2
(45) Date of Patent: Nov. 20, 2007

(54) ELECTRONIC CIRCUIT DEVICE

(75) Inventors: Nobutake Tsuyuno, Chiyoda-ku (JP);
Toshiaki Ishii, Chiyoda-ku (JP);
Toshiya Satoh, Chiyoda-ku (JP);
Mitsuhiro Masuda, Chiyoda-ku (JP)

(73) Assignee: Hitachi, Ltd., Tokyo (JP)

( * ) Notice: Subject to any disclaimer, the term of this patent is extended or adjusted under 35 U.S.C. 154(b) by 278 days.

(21) Appl. No.: 10/910,903

(22) Filed: Aug. 4, 2004

(65) Prior Publication Data

US 2005/0030823 A1 Feb. 10, 2005

(30) Foreign Application Priority Data

Aug. 8, 2003 (JP) ............................... 2003-206648

(51) Int. Cl.
*H01L 23/22* (2006.01)

(52) U.S. Cl. .................. 257/687; 257/724; 257/729; 257/E23.026

(58) Field of Classification Search .............. 257/687, 257/723, 724, 729, E23.018, E23.026
See application file for complete search history.

(56) References Cited

U.S. PATENT DOCUMENTS

| | | | | |
|---|---|---|---|---|
| 5,250,843 | A * | 10/1993 | Eichelberger | 257/692 |
| 5,767,447 | A * | 6/1998 | Dudderar et al. | 174/546 |
| 6,040,039 | A * | 3/2000 | Ikeda et al. | 428/210 |
| 6,232,657 | B1 * | 5/2001 | Komorita et al. | 257/700 |
| 6,833,617 | B2 * | 12/2004 | Kondo et al. | 257/707 |
| 6,873,042 | B2 * | 3/2005 | Ishii et al. | 257/702 |
| 2004/0212965 | A1 * | 10/2004 | Ishii et al. | 361/709 |

FOREIGN PATENT DOCUMENTS

| | | |
|---|---|---|
| JP | 06-196614 | 7/1994 |
| JP | 08-078618 | 3/1996 |
| JP | 09-051056 | 2/1997 |
| JP | 10-79453 | 3/1998 |
| JP | 10-135377 | 5/1998 |
| JP | 2000-119629 | 4/2000 |
| JP | 2001-196513 | 7/2001 |
| JP | 2001-291808 | 10/2001 |

* cited by examiner

*Primary Examiner*—T. N. Quach
(74) *Attorney, Agent, or Firm*—Crowell & Moring LLP

(57) ABSTRACT

In order to provide a low-cost and high heat-radiating electronic circuit device featuring high compactness, little warpage, high air tightness, high moldability, high mass productivity, high reliability against thermal shocks, and high oil-proof reliability, a module structure made by packing a whole multi-layer circuit board which connects a semiconductor operating element, semiconductor memory elements, and passive elements thereon and part of a supporting material on which said multi-layer circuit board is placed into a single package by transfer-molding; wherein said multi-layer circuit board and said supporting material are bonded together with a compound metallic material made up from copper oxide and at least one metal selected from a set of gold, silver, and copper.

13 Claims, 4 Drawing Sheets

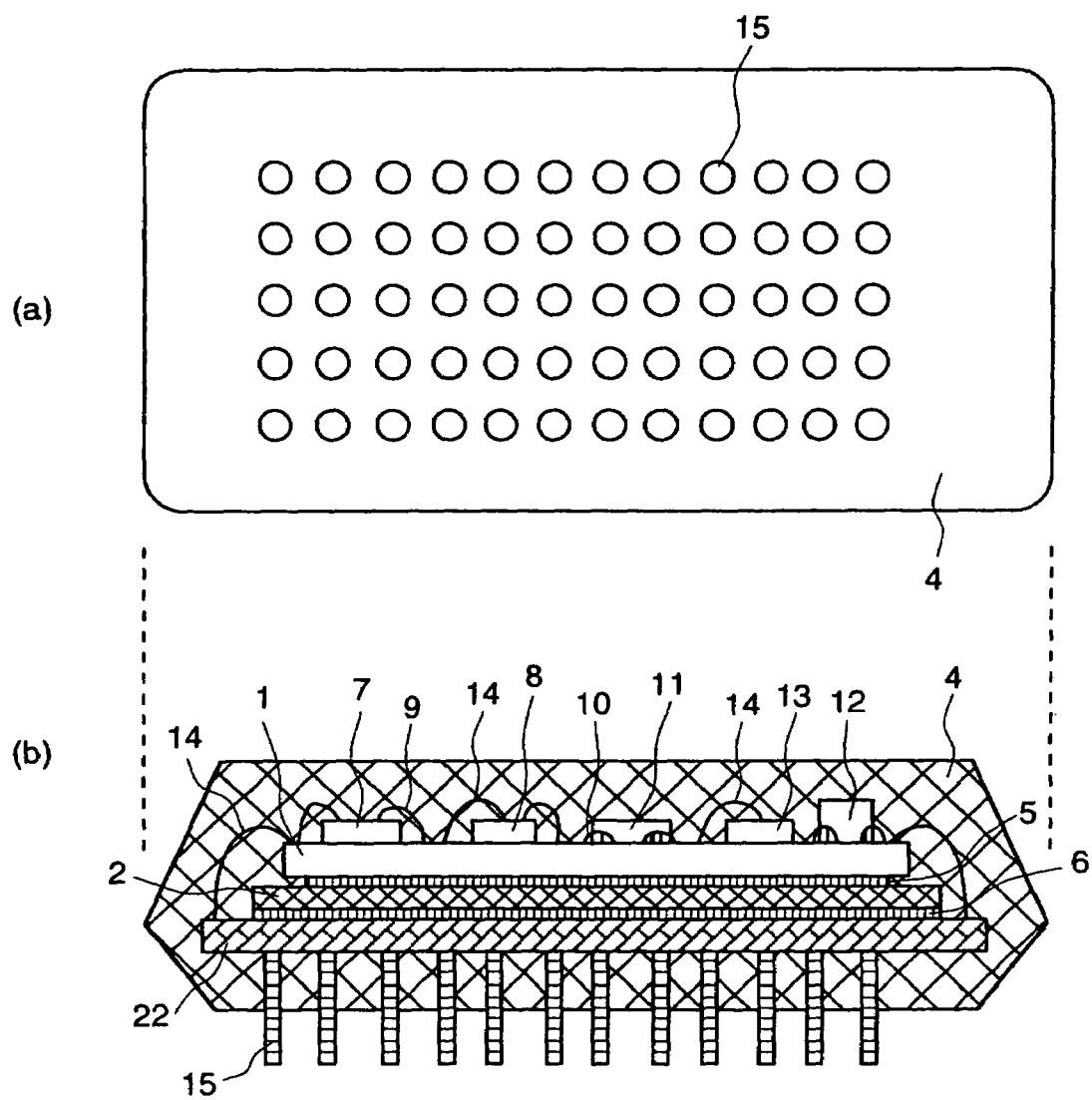

ELECTRONIC CIRCUIT DEVICE

CROSS-REFERENCE TO A RELATED APPLICATION

This application claims the benefit of the filing date of Japanese Patent Application No. 2003-206648, filed on Aug. 8, 2003.

BACKGROUND OF THE INVENTION

This invention relates to an electronic circuit device made by packing a module structure comprising a multi-layer circuit board which connects a semiconductor operating element, semiconductor memory elements, and passive elements thereon into a single package with a packing resin component.

Modules using semiconductor integrated circuits have been used not only for small electronic devices such as video cameras and cellular phones but also to control car engines and revolutions of train wheels. Each of such modules builds electronic parts having semiconductor functions and electronic parts having resistance functions on a circuit board to control signals. To increase the reliability, an example of such modules is manufactured by bonding a circuit board in a casing, mounting electronic parts in place on the circuit board and packing thereof with silicone gel which is flexible in a wide temperature range. This example has been well known as a module that can improve the withstand voltage characteristic. However, this kind of module uses a casing. This results in making its size greater. Further, silicone gel takes a lot of time in injection and hardening and is low in heat radiation characteristic. Japanese Application Patent Laid-Open Publication No. Hei 10-79453 discloses a method of packing a module with a thermosetting resin component. This method packs one side of a circuit board with a thermosetting resin. As the coefficient of thermal expansion of the thermosetting resin component is different from that of the circuit board, the module is apt to warp. Japanese Application Patent Laid-Open Publication No. Hei 10-135377 discloses a method to make the coefficient of thermal expansion of the thermosetting resin closer to that of the circuit board. However, as this method also packs only one side of the circuit board, the interface between the circuit board and the thermosetting resin component is mostly exposed to the atmosphere and apt to be separated.

As a method for molding the whole circuit board, Japanese Application Patent Laid-Open Publication No. Hei 09-51056 discloses a method to pack the ceramic multi-layer circuit board with a packing material. This invention is characterized in that the electrode connection section is stepped along the layers of the multi-layer circuit board, but this invention has no means to improve the capability of heat radiation of the module.

Japanese Application Patent Laid-Open Publication No. Hei 08-78618 discloses a method to improve the capability of heat radiation of the module by using a thermal conductive block. This thermal conductive block for heat radiation is made of aluminum nitride having a high modulus of elasticity. So when exposed to a rapid temperature change such as from −55° C. to 150° C., the packing resin component may have cracks due to thermal stresses.

Japanese Application Patent Laid-Open Publication No. 2001-291808 discloses a power semiconductor integrated circuit which eliminates separation and cracks in the module by bonding a base material and a heat sink together with an adhesive which is made by dispersing ceramics in a brazing material made of aluminum alloy and copper alloy to have a thermal expansion coefficient which is between those of the base material and the heat sink. However, this integrated circuit is not a module structure which connects a semiconductor operating element, semiconductor memory elements, and passive elements thereon and cannot be used as an electronic circuit device.

Japanese Application Patent Laid-Open Publication No. Hei 06-196614 discloses an invention concerning a lead frame made by bonding a stress relief material whose thermal expansion coefficient is close to that of a semiconductor device to the lead frame. This lead frame is resistant to cracks due to stresses but this invention does not take the heat radiation of the stress relief material into consideration. Further, as this invention tries to make the thermal expansion coefficient of the stress relief material close to that of a semiconductor device, a thermal stress will converge on the interface between the lead frame and the stress relief material, and consequently, the lead frame may separate from the stress relief material.

Japanese Application Patent Laid-Open Publication No. 2001-196513 discloses an invention concerning a compound metallic material of high thermal conductivity and low thermal expansion which is made from copper and copper oxide. However, this is not related to a resin packed electronic circuit device which connects a semiconductor operating element, semiconductor memory elements, and passive elements thereon.

Further, Japanese Application Patent Laid-Open Publication No. 2000-119629 discloses an invention concerning an adhesive resin component mixed up with inorganic filling material that contains 50 to 99.9 parts by weight of silver and 0.1 to 50 parts by weight of copper oxide. This adhesive resin component is used to bond a lead frame to a semiconductor chip. However, this invention does not take the capability of heat radiation and resistance to thermal stresses into consideration.

[Patent Document 1]
Japanese Application Patent Laid-Open Publication No. Hei 10-79453
[Patent Document 2]
Japanese Application Patent Laid-Open Publication No. Hei 10-135377
[Patent Document 3]
Japanese Application Patent Laid-Open Publication No. Hei 09-51056
[Patent Document 4]
Japanese Application Patent Laid-Open Publication No. Hei 08-78618
[Patent Document 5]
Japanese Application Patent Laid-Open Publication No. 2001-291808
[Patent Document 6]
Japanese Application Patent Laid-Open Publication No. Hei 06-196614
[Patent Document 7]
Japanese Application Patent Laid-Open Publication No. 2001-196513
[Patent Document 8]
Japanese Application Patent Laid-Open Publication No. 2000-119629

SUMMARY OF THE INVENTION

Recently, control devices of vehicles have been demanded to have high control functions to assure comfortable ride and good mileage of vehicles. Further, they have been demanded to reduce production costs and the number of parts. To meet such demands, control devices have been modularized to combine semiconductor elements, resistors, and capacitors. Recently, however, a machine has been required to house its control device in it to further reduce the number of parts. For example, some approaches have been made to build a control device in a transmission to unify a control device and a machine part. Such a control device is required to overcome the problems below. The first problem is downsizing. The control device must be made smaller to be housed in a limited space in a machine part. The second problem is a warpage. The control device should have a little warpage to be housed in a limited space. The third problem is a resistance to thermal changes. The control device should not cause any separation and cracks and should assure its reliability after a long-period exposure to violent thermal changes near a machine part. The fourth problem is an oil resistance. The control device should be so reliable not to cause any malfunction and part separation even in oily hot environments. The fifth problem is a heat radiation. The control device should have a good heat-radiation ability to keep its temperature below the high temperature limit of a semiconductor element that works in a hot operating environment.

After carefully examining the above problems, we inventors have found that a compound metallic material made from copper oxide and at least one metal selected from a set of gold, silver, and copper is low in modulus of elasticity but high in thermal conductivity and high in adhesiveness to a packing material. We made a module structure by bonding a multi-layer circuit board which connects a semiconductor operating element, semiconductor memory elements, and passive elements thereon and a supporting material with this compound metallic material and packing these into a single package by transfer-molding. We have also found that this resulting downsized electronic circuit device having little warpage excels in resistance to thermal changes, resistance to oil, and heat radiation. From the above facts, we have completed this invention. In other words, this invention is characterized in the electronic circuit devices below.

An electronic circuit device of a module structure made by packing a whole multi-layer circuit board which connects a semiconductor operating element, semiconductor memory elements, and passive elements thereon and part of a supporting material on which the multi-layer circuit board is placed into a single package by transfer-molding with a packing resin component; wherein the multi-layer circuit board and the supporting material are bonded together with a compound metallic material made up from copper oxide and at least one metal selected from a set of gold, silver, and copper.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper oxide and at least one metal selected from a set of gold, silver, and copper, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, as this compound metallic material is strongly bonded to the packing material, no separation will occur between the compound metallic material and the packing material.

An electronic circuit device of a module structure made by packing a whole multi-layer circuit board which connects a semiconductor operating element, semiconductor memory elements, and passive elements thereon and part of a supporting material on which the multi-layer circuit board is placed into a single package by transfer-molding with a packing resin component; wherein the multi-layer circuit board and the supporting material are bonded together with a compound metallic material made up from copper and copper oxide.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, as this compound metallic material is strongly bonded to the packing material, no separation will occur between the compound metallic material and the packing material. Further, the use of copper and copper oxide has an effect to reduce the production cost of the electronic circuit device.

An electronic circuit device of a module structure made by packing a whole ceramic multi-layer circuit board which connects a semiconductor operating element, semiconductor memory elements, and passive elements thereon and part of a supporting material on which the ceramic multi-layer circuit board is placed into a single package by transfer-molding with a packing resin component; wherein the ceramic multi-layer circuit board and the supporting material are bonded together with a compound metallic material made up from copper and copper oxide.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, as this compound metallic material is strongly bonded to the packing material, no separation will occur between the compound metallic material and the packing material. Further, the use of the ceramic multi-layer circuit board has an effect to increase the thermal conductivity and improve the heat radiation property.

An electronic circuit device of a module structure made by packing a whole multi-layer circuit board which connects a semiconductor operating element, semiconductor memory elements, and passive elements thereon and part of a supporting material on which the multi-layer circuit board is placed into a single package by transfer-molding with a packing resin component; wherein the supporting material contains copper in major proportions and the multi-layer circuit board and the supporting material are bonded together with a compound metallic material made up from copper and copper oxide.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, as this compound metallic material is strongly bonded to the packing material, no separation will occur between the compound metallic material and the packing material. Further, the use of a metallic material containing copper in major proportions has an effect to improve the heat radiation property.

An electronic circuit device of a module structure made by packing a whole multi-layer circuit board which connects a semiconductor operating element, semiconductor memory elements, and passive elements thereon and part of a supporting material on which the multi-layer circuit board is placed into a single package by transfer-molding with a packing resin component; wherein the packing resin component contains 75% or more by volume of inorganic filling material and the multi-layer circuit board and the supporting material are bonded together with a compound metallic material made up from copper and copper oxide.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, this compound metallic material is strongly bonded to the packing material and has an effect to suppress a separation of parts. The packing resin component containing 75% or more by volume of inorganic filling material can improve its oil resistance.

An electronic circuit device of a module structure made by packing a whole multi-layer circuit board which connects a semiconductor operating element, semiconductor memory elements, and passive elements thereon and part of a supporting material on which the multi-layer circuit board is placed into a single package by transfer-molding with a packing resin component; wherein the supporting material contains copper in major proportions and the multi-layer circuit board and the supporting material are bonded together with a compound metallic material which is made up from copper and copper oxide and greater than the multi-layer circuit board.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, this compound metallic material is strongly bonded to the packing material and has an effect to suppress a separation of parts. Furthermore, as the compound metallic material made from copper and copper oxide is greater than the multi-layer circuit board, stresses will converge on the compound metallic material rather than the multi-layer circuit board. This can prolong the lives of elements connected to the multi-layer circuit board.

An electronic circuit device of a module structure made by packing a whole multi-layer circuit board which connects a semiconductor operating element, semiconductor memory elements, and passive elements thereon and part of a supporting material on which the multi-layer circuit board is placed into a single package by transfer-molding with a packing resin component; wherein the supporting material contains copper in major proportions and the multi-layer circuit board and the supporting material are bonded together with a compound metallic material which is made up from copper and copper oxide using an organic adhesive to bond the multi-layer circuit board and the compound metallic material.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, this compound metallic material is strongly bonded to the packing material and has an effect to suppress a separation of parts. Furthermore, the organic adhesive used to bond the compound metallic material to the multi-layer circuit board has an effect to release the stresses and prevent parts separation.

An electronic circuit device of a module structure made by packing a whole multi-layer circuit board which connects a semiconductor operating element, semiconductor memory elements, and passive elements thereon and part of a supporting material on which the multi-layer circuit board is placed into a single package by transfer-molding with a packing resin component; wherein the supporting material contains copper in major proportions and the multi-layer circuit board and the supporting material are bonded together with a compound metallic material which is made up from copper and copper oxide using an organic adhesive to bond the compound metallic material and the supporting material.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, the organic adhesive used to bond the compound metallic material to the supporting material has an effect to release the stresses and prevent parts separation.

An electronic circuit device of a module structure made by packing a whole ceramic multi-layer circuit board which connects a semiconductor operating element, semiconductor memory elements, and passive elements thereon and part of a supporting material on which the ceramic multi-layer circuit board is placed into a single package by transfer-molding with a packing resin component; wherein the supporting material is a metallic material containing copper in major proportions, the packing resin component contains 75% or more by volume of inorganic filling material, the multi-layer circuit board and the supporting material are bonded together with a compound metallic material which is made up from copper and copper oxide and greater than the multi-layer circuit board, and an organic adhesive is used to bond the ceramic multi-layer circuit board to the compound metallic material and the compound metallic material to the supporting material.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, the use of the ceramic multi-layer circuit board has an effect to increase the thermal conductivity and improve the heat radiation property. Further, the use of a metallic material containing copper in major proportions has an effect to improve the heat radiation property. The packing resin component containing 75% or more by volume of inorganic filling material can improve its oil resistance. As the compound metallic material made from copper and copper oxide is greater than the multi-layer circuit board, stresses will converge on the compound metallic material rather than the multi-layer circuit board. This can prolong the lives of elements connected to the multi-layer circuit board. The organic adhesive used to bond the compound metallic material to the multi-layer circuit board has an effect to release the stresses and prevent parts separation. Furthermore, the organic adhesive used to bond the compound metallic material to the supporting material has an effect to release the stresses and prevent parts separation.

An electronic circuit device of a module structure made by packing a whole ceramic multi-layer circuit board which connects a semiconductor operating element, semiconductor memory elements, and passive elements thereon and part of a supporting material on which the ceramic multi-layer circuit board is placed into a single package by transfer-molding with a packing resin component; wherein the supporting material is a metallic material containing copper in major proportions, the packing resin component contains 75% or more by volume of inorganic filling material, the multi-layer circuit board and the supporting material are bonded together with a compound metallic material having a void content of 1 to 50% by volume which is made up from copper and copper oxide and greater than the multi-layer circuit board, and an organic adhesive is used to bond the ceramic multi-layer circuit board to the compound metallic material and the compound metallic material to the supporting material.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, the use of the ceramic multi-layer circuit board has an effect to increase the thermal conductivity and improve the heat radiation property. Further, the use of a metallic material containing copper in major proportions has an effect to improve the heat radiation property. The packing resin component containing 75% or more by volume of inorganic filling material can improve its oil resistance. As the compound metallic material made from copper and copper oxide is greater than the multi-layer circuit board, stresses will converge on the compound metallic material rather than the multi-layer circuit board. This can prolong the lives of elements connected to the multi-layer circuit board. The organic adhesive used to bond the compound metallic material to the multi-layer circuit board has an effect to release the stresses and prevent parts separation. The organic adhesive used to bond the compound metallic material to the supporting material has an effect to release the stresses and prevent parts separation. Furthermore, as the compound metallic material has the void content of 1 to 50% by volume, the metallic material is high in thermal conductivity and low in modulus of elasticity. This has an effect to improve heat radiation and reliability.

An electronic circuit device of a module structure made by packing a whole ceramic multi-layer circuit board which connects a semiconductor operating element, semiconductor memory elements, and passive elements thereon and part of a supporting material on which the ceramic multi-layer circuit board is placed into a single package by transfer-molding with a packing resin component; wherein the supporting material is a metallic material containing copper in major proportions, the packing resin component contains 75% or more by volume of inorganic filling material, the multi-layer circuit board and the supporting material are bonded together with a compound metallic material which is made up from copper and copper oxide and greater than the multi-layer circuit board, the surface roughness (Ra) is between 0.01 and 500 μm (including both) in 40% or more of the surface area of the compound metallic material (where Ra is an arithmetic average of roughness defined by JIS B 0660, 1998), and an organic adhesive is used to bond the ceramic multi-layer circuit board to the compound metallic material and the compound metallic material to the supporting material.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, the use of the ceramic multi-layer circuit board has an effect to increase the thermal conductivity and improve the heat radiation property. Further, the use of a metallic material containing copper in major proportions has an effect to improve the heat radiation property. The packing resin component containing 75% or more by volume of inorganic filling material can improve its oil resistance. As the compound metallic material made from copper and copper oxide is greater than the multi-layer circuit board, stresses will converge on the compound metallic material rather than the multi-layer circuit board. This can prolong the lives of elements connected to the multi-layer circuit board. The organic adhesive used to bond the compound metallic material to the multi-layer circuit board has an effect to release the stresses and prevent parts separation. The organic adhesive used to bond the compound metallic material to the supporting material has an effect to release the stresses and prevent parts separation. Furthermore, as the surface roughness (Ra) is between 0.01 and 500 μm (including both) in 40% or more of the surface area of the compound metallic material (where Ra is an arithmetic average of roughness defined by JIS B 0660, 1998), this has an effect to improve the adhesiveness to the packaging resin component and the reliability.

An electronic circuit device of a module structure made by packing a whole ceramic multi-layer circuit board which connects a semiconductor operating element, semiconductor memory elements, and passive elements thereon and part of a supporting material on which the ceramic multi-layer circuit board is placed into a single package by transfer-molding with a packing resin component; wherein the supporting material is a metallic material containing copper in major proportions, the packing resin component contains 75% or more by volume of inorganic filling material, the multi-layer circuit board and the supporting material are bonded together with a compound metallic material which is made up from copper and copper oxide and greater than the multi-layer circuit board, the ratio of copper oxide to the compound metallic material is 10% to 50% by volume, and, an organic adhesive is used to bond the ceramic multi-layer circuit board to the compound metallic material and the compound metallic material to the supporting material.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, the use of the ceramic multi-layer circuit board has an effect to increase the thermal conductivity and improve the heat radiation property. Further, the use of a metallic material containing copper in major proportions has an effect to improve the heat radiation property. The packing resin component containing 75% or more by volume of inorganic filling material can improve its oil resistance. As the compound metallic material made from copper and copper oxide is greater than the multi-layer circuit board, stresses will converge on the compound metallic material rather than the multi-layer circuit board. This can prolong the lives of elements connected to the multi-layer circuit board. The organic adhesive used to bond the compound metallic material to the multi-layer circuit board has an effect to release the stresses and prevent parts separation. The organic adhesive used to bond the compound metallic material to the supporting material has an effect to release the stresses and prevent parts separation. Furthermore, the ratio of copper oxide to the compound metallic material is 10% to 50% by volume has an effect to improve the low modulus of elasticity and high thermal conductivity.

The semiconductor operating elements in accordance with this invention mean elements that have a computing or switching function. The elements having the computing function are microcomputers and the like. The elements having the switching function are transistors and the like. The semiconductor memory elements mean memory elements that store control programs and signals. A memory element is usually built in a microcomputer, but it can be provided outside the microcomputer. The passive elements mean resistors, capacitors, diodes, and the like.

The multi-layer circuit board in accordance with this invention can be any as long as it has at least four circuit layers on it. The multi-layer circuit board can be one or a combination of boards selected from a set of ceramic multi-layer circuit boards using aluminum as the main board material, glass epoxy circuit boards using glass fiber impregnated with epoxy resin, paper phenol circuit boards using paper impregnated with phenol resin, glass BT resin circuit boards using glass fiber impregnated with bismaleimide triazine resin, polyimide circuit boards using polyimide resin, Teflon (registered trademark) circuit boards using Teflon, and polyphenylene ether circuit boards using polyphenylene ether resin. A ceramic multi-layer circuit board is more preferable. This is because the ceramic multi-layer circuit board has a high thermal conductivity and improves the heat radiation of the electronic circuit device.

The supporting material in accordance with this invention can be any as long as it is a material of high thermal conductivity. A preferable supporting material contains copper as a main ingredient and one or more selected from a set of Fe, P, Zn, Ni, Si, Cr, Sn, and Mg as additional ingredients. This supporting material can be used directly or with its exposed areas covered with an organic film or a metal plating if required for assurance of reliability. Such organic films can be any of polyamideimide, polyimide, epoxy resin, coupling agent, chelating agent and so on. Such metal plates are made by plating with metal including Sn, Au, or Ni in major proportions. Judging from points of cost reduction and reliability of connection, plating with metal including Sn is preferable.

The material for packing a circuit board into a single package in accordance with this invention can be any as long as it is a thermosetting resin component that can be molded into a package. The preferable packing material should always contain epoxy resin, hardening agent, hardening accelerator, and inorganic filling material. An epoxy resin composition is preferable.

The epoxy resin can be any as long as it contains two or more epoxy groups per molecule. For example, such epoxy resins are o-cresol novolak type epoxy resin, naphthalene type epoxy resin, di-cyclo-penta-diene epoxy resin, brominated epoxy resin, biphenyl type epoxy resin, bisphenol A type epoxy resin, bisphenol F type epoxy resin, and so on. A biphenyl type epoxy resin whose melting viscosity is low is preferable.

The hardening agent resin can be any as long as it contains functional groups to harden epoxy resin such as phenolic hydroxyl group, amino group, carboxylic group, and acid anhydride. Such hardening agents are phenol novolak, xylylene type phenol resin, di-cyclo-penta-diene type phenol resin, and cresol phenol novolak. A phenol novolak whose melting viscosity is low is preferable.

The inorganic filling material can be any selected from a set of silica, alumina, boron nitride, magnesium hydroxide etc., and magnesium hydroxide Silica is preferable because its mechanical and hardening properties are balanced. Although there are two kinds of silica: fused silica and crystalline silica, fused silica is preferable because its coefficient of thermal expansion is little. The fused silica can have any shape (spherical or granule), but spherical fused silica is preferable because it is more flowable. 95% or more by weight of the inorganic filling material is preferably 0.1 to 100 μm in diameter, and more preferably 2 to 20 μm in diameter. The filling material in this diameter range has a maximum filling factor. Even when the filling material is added to the epoxy resin at a high filling rate, the melting viscosity of the epoxy resin compound remains low. The filling rate of the inorganic filling material is preferably 50% or more by volume of the whole volume of the epoxy resin compound and more preferably 75% or more by volume judging from the coefficient of thermal expansion.

The hardening accelerator can be any as long as it can accelerate hardening of the epoxy resin. Such hardening accelerators can be phosphorous compounds (such as tri-phenyl phosphine, tri-phenyl phosphine, tri-phenyl boron, tetra-phenyl phosphonium, tetra-phenyl borate, butyl-tri-phenyl-phosphonium, and tetra-phenyl borate), imidazole compounds (such as 2-phenyl-4-benzyl-5-hydroxymethyl imidazole, 2-phenyl-4-methyl-5-hydroxymethyl imidazole, and 2-ethyl-4-methyl imidazole), and amine compounds (such as 1,8-diazabicyclo[5,4,0]-undesen-7, di-amino-phenyl methane, di-amino-di-phenyl methane, and tri-ethylene-di-amine).

Besides the above ingredients, the epoxy resin compound can contain mold-releasing agent. Coloring agent, elasticizing agent, auxiliary flame retardant, and so on. Available packing methods are transfer molding, injection molding, potting molding, etc. but the transfer molding is preferable judging from a point of mass productivity. This is because the transfer molding method excels in mass production and reliability. When the above epoxy resin compound is packed by the transfer molding, the molding temperature is between 150° C. and 200° C. (not including 200° C.). At lower than 150° C., the hardening reaction of the epoxy resin is slow and the resulting product is hard to be released from the mold. To improve the mold releasing property of the epoxy resin, the hardening time must be made longer. This reduces the mass productivity. At 200° C. or higher, the hardening reaction advances quickly and its fluidity goes low. Consequently, filling may be incomplete. Therefore, the preferable molding temperature is about 180° C.

The compound metallic material in accordance with this invention can be any as long as it is made from copper oxide and at least one selected from a set of gold, silver, and copper. A set of copper and copper oxide is preferable judging from a point of production cost. The copper oxide can be CuO, $Cu_2O$, or both. $Cu_2O$ is preferable because the compound metallic material using $Cu_2O$ is better in mechanical characteristics than the compound metallic material using CuO.

BRIEF DESCRIPTION OF THE DRAWINGS

FIG. 1(a) is the top perspective view of the device and FIG. 1(b) is the diagrammatical vertical sectional view of the device.

FIG. 7 shows an electronic circuit device which is an embodiment of this invention. FIG. 7(a) is the bottom view of the device and FIG. 7(b) is the diagrammatical vertical sectional view of the device.

DETAILED DESCRIPTION OF THE PREFERRED EMBODIMENT

This invention will be described in further detail by way of embodiments.

Embodiment 1

Figure 1:
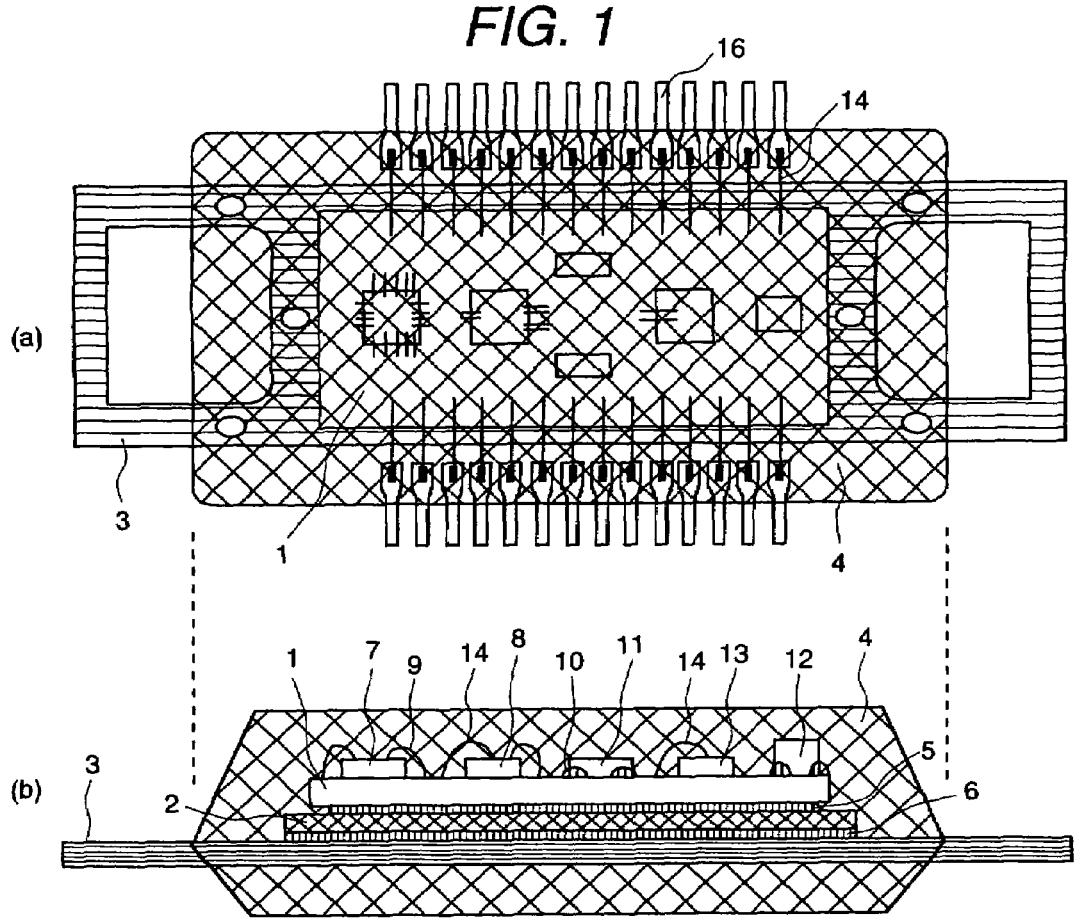
FIG. 1 shows an electronic circuit device which is an embodiment of this invention.
Figure 2:
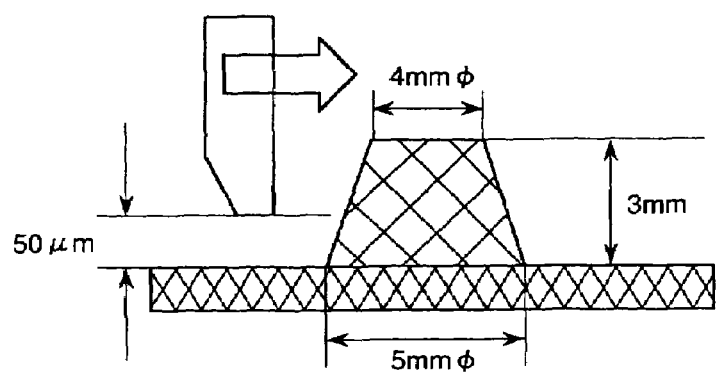
FIG. 2 shows a method of testing the strength of adhesion of the packaging resin component to the compound metallic material.

The electronic circuit device of Embodiment 1 has a structure shown in FIG. 1. Referring to FIG. 1, the multi-layer circuit board 1 is a 6-layer glass BT resin multi-layer circuit board (50 mm×40 mm). The outermost layer of the board is a copper sheet plated with nickel of 5 μm thick. We prepared the compound metallic material 2 by mixing silver powder and $Cu_2O$ powder, cold-pressing the mixture, and sintering it at 950° C. for three hours. The resulting compound metallic material is 50 mm long×40 mm wide×0.7 mm thick containing 70% by volume of silver and 30% by volume of $Cu_2O$. We prepared an electronic circuit device by welding the compound metallic material 2 to an aluminum supporting material (junction 6), printing solder (junction 5) of 3.5 parts of Ag, 0.3 part of Cu, and 96.2 parts of Sn by weight on the compound metallic material, dispensing silver paste in place on the multi-layer circuit board to mark locations of a bare-chip microcomputer 7 containing memory, a transistor 8, and a diode 13, placing the microcomputer 7, a transistor 8, and a diode 13 on the locations, hardening the silver paste at 150° C. for one hour for adhesion, heating the microcomputer 7 containing memory up to 200° C. from the circuit side of the multi-layer circuit board on the heating stage, electrically connecting pats of the microcomputer 7 and the lands on the multi-layer circuit board 1 with gold wires 9 by the ultrasonic wire-bonding, dispensing the solder paste of 3.5 parts of Ag, 0.3 part of Cu, and 96.2 parts of Sn by weight as a conductive material 10 to the lands on the multi-layer circuit board 1, placing parts such as resistors 11 and capacitors 12 on the multi-layer circuit board 1, placing the multi-layer circuit board 1 on the solder-printed side of an assembly of the supporting material and the compound metallic material 2, melting solder (junction 5) and the conductive material 10 at 270° C. by the infrared reflow equipment, solidifying thereof to make electric connections between the electronic parts (resistors 11 and capacitors 12) and the multi-layer circuit board 1, connecting terminals 15, the transistor 8, and the diode 13 to the multi-layer circuit board with Al wires (as wire 14) at a room temperature by ultrasonic wire bonding, applying the packaging resin component 4 which contains 63% by volume of silica filler as an inorganic filling material and gels in 30 seconds at 180° C., and molding the resin component 4 at a mold temperature of 180° C. and a transfer pressure of 7 MPa for three minutes by a low-pressure transfer-molding. The characteristics of the packaging resin component after hardening are 3 GPa (as the modulus of elasticity at a room temperature), 16 ppm/° C. (as the coefficient of line expansion), and 150° C. (as the glass transition temperature).

We tested this prepared electronic circuit device for warpage, air tightness, moldability, mass productivity, malfunction, separation, and cracks after a thermal shock of 2000 cycles, separation, malfunction, and heat radiation after dipping in oil at 140° C. for 2000 hours. Table 1 lists the result of this test.

To measure the adhesion strength between the compound metallic material and the packaging resin component, we formed a truncated cone of the packaging resin component on the compound metallic material by transfer molding, applied a strain to the truncated cone 50 µm high above the base at a speed of 2 mm/minute by a shearing tool, and got the shearing adhesion strength from a strength at which the truncated cone is broken. We repeated the above using four to five samples and took their average.

We measured the surface roughness (Ra) of the compound metallic material using the stylus type surface roughness tester. The surface roughness (Ra) is an arithmetic mean roughness defined by JIS B 0660 (1998).

We measured the warpage of the electronic circuit device using a three-dimensional warpage tester. The tested electronic circuit device is evaluated to be acceptable (○) when the warpage is less than 200 µm and not acceptable (×) when the warpage is 200 µm or more. We checked the air tightness of the electronic circuit devices after a thermal shock of 3000 cycles by the dye penetrant testing method (color check) using a penetrant test dye. The tested electronic circuit device is evaluated to be acceptable (○) when the ink penetration is 1.0 mm or longer, almost acceptable (Δ) when the ink penetration is between 0.5 mm and 1 mm (not including 1 mm), and not acceptable (×) when the ink penetration is shorter than 0.5 mm. The moldability of the circuit device package is evaluated to be acceptable (○) when the package is made causing no problem in fluidity and mold releasing or not acceptable (×) when the package has any problem in fluidity and mold releasing. We evaluated the mass productivity of the electronic circuit devices by a time period between the beginning of electrical connection of electronic parts on the multi-layer circuit board and the end of packing with resin. The mass productivity is evaluated to be acceptable (○) when the time period is shorter than 30 minutes or not acceptable (×) when the time period is 30 minutes or longer.

We tested the thermal shock reliability of the electronic circuit device by keeping the circuit device at respective preset temperatures in sequence between −55° C. and 150° C. for 60 minutes, repeating this thermal shock cycle 2000 times, and checking the circuit device for separation, cracks, and malfunction. We used ten circuit devices as test samples. We used an ultrasonic flaw imaging device to check for separations. We checked for cracks by eyes. When finding any internal disconnection, we evaluated the device as "Malfunctioned."

We tested the oil-proof reliability of the electronic circuit device by dipping the circuit device hot automatic engine oil of 140° C. for 2000 hours and checking for separations and malfunctions.

We evaluated the heat radiation of the electronic circuit device by calculating the junction temperature of the transistor from a voltage between the base and the emitter of the transistor and taking a difference between the junction temperature and the atmospheric temperature. The heat radiation of the electronic circuit device should be 15° C. or lower.

The electronic circuit device prepared as described above is a single package which packs the whole multi-layer circuit board. This can reduce the size and warpage of the device and makes the device highly resistant to oil. Further as the multi-layer circuit board and the supporting material are bonded to each other with a compound metallic material made from copper oxide and at least one metal selected from a set of gold, silver, and copper, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, as this compound metallic material is strongly bonded to the packing material, no separation will occur between the compound metallic material and the packing material.

Embodiment 2

The electronic circuit device of Embodiment 2 has a structure shown in FIG. 1. Referring to FIG. 1, the multi-layer circuit board 1 is a 6-layer glass BT resin multi-layer circuit board (50 mm×40 mm). The outermost layer of the board is a copper sheet plated with nickel of 5 µm thick. We prepared the compound metallic material 2 by mixing copper powder and $Cu_2O$ powder, cold-pressing the mixture, and sintering it at 950° C. for three hours. The resulting compound metallic material is 50 mm long×40 mm wide× 0.7 mm thick containing 70% by volume of copper and 30% by volume of $Cu_2O$. The surface roughness (Ra) is 0.2 in 40% or more of the surface area of the compound metallic material and the void content is 6.5%. We prepared an electronic circuit device by welding the compound metallic material 2 to an aluminum supporting material 3 (junction 6), printing solder (junction 5) of 3.5 parts of Ag, 0.3 part of Cu, and 96.2 parts of Sn by weight on the compound metallic material, dispensing silver paste in place on the multi-layer circuit board to mark locations of a bare-chip microcomputer 7 containing memory, a transistor 8, and a diode 13, placing the microcomputer 7, a transistor 8, and a diode 13 on the locations, hardening the silver paste at 150° C. for one hour for adhesion, heating the microcomputer 7 containing memory up to 200° C. from the circuit side of the multi-layer circuit board on the heating stage, electrically connecting pats of the microcomputer 7 and the lands on the multi-layer circuit board 1 with gold wires 9 by the ultrasonic wire-bonding, dispensing the solder paste of 3.5 parts of Ag, 0.3 part of Cu, and 96.2 parts of Sn by weight as a conductive material 10 to the lands on the multi-layer circuit board 1, placing parts such as resistors 11 and capacitors 12 on the multi-layer circuit board 1, placing the multi-layer circuit board 1 on the solder-printed side of an assembly of the supporting material and the compound metallic material 2, melting solder (junction 5) and the conductive material 10 at 270° C. by the infrared reflow equipment, solidifying thereof to make electric connections between the electronic parts (resistors 11 and capacitors 12) and the multi-layer circuit board 1, connecting terminals 15, the transistor 8, and the diode 13 to the multi-layer circuit board with Al wires (as wire 14) at a room temperature by ultrasonic wire bonding, applying the packaging resin component 4 which contains 63% by volume of silica filler as an inorganic filling material and gels in 30 seconds at 180° C., and molding the resin component 4 at a mold temperature of 180° C. and a transfer pressure of 7 MPa for three minutes by a low-pressure transfer-molding. The characteristics of the packaging resin component after hardening are 3 GPa (as the modulus of elasticity at a room temperature), 16 ppm/° C. (as the coefficient of line expansion), and 150° C. (as the glass transition temperature).

We tested this prepared electronic circuit device for warpage, air tightness, moldability, mass productivity, malfunction, separation, and cracks after a thermal shock of 2000 cycles, separation, malfunction, and heat radiation after dipping in oil at 140° C. for 2000 hours. Table 1 lists the result of this test.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, as this compound metallic material is strongly bonded to the packing material, no separation will occur between the compound metallic material and the packing material. Further, the use of copper and copper oxide has an effect to reduce the production cost of the electronic circuit device.

Embodiment 3

The electronic circuit device of Embodiment 3 has a structure shown in FIG. 1. Referring to FIG. 1, the multi-layer circuit board 1 is a 6-layer ceramic multi-layer circuit board (50 mm×40 mm). The outermost layer of the board is a solid wiring pattern plated with nickel of 5 μm thick. We prepared the compound metallic material 2 by mixing copper powder and $Cu_2O$ powder, cold-pressing the mixture, and sintering it at 950° C. for three hours. The resulting compound metallic material is 50 mm long×40 mm wide× 0.7 mm thick containing 70% by volume of copper and 30% by volume of $Cu_2O$. The surface roughness (Ra) is 0.2 in 40% or more of the surface area of the compound metallic material and the void content is 6.5%. We prepared an electronic circuit device by welding the compound metallic material 2 to an aluminum supporting material 3 (junction 6), printing solder (junction 5) of 3.5 parts of Ag, 0.3 part of Cu, and 96.2 parts of Sn by weight on the compound metallic material, dispensing silver paste in place on the multi-layer circuit board to mark locations of a bare-chip microcomputer 7 containing memory, a transistor 8, and a diode 13, placing the microcomputer 7, a transistor 8, and a diode 13 on the locations, hardening the silver paste at 150° C. for one hour for adhesion, heating the microcomputer 7 containing memory up to 200° C. from the circuit side of the multi-layer circuit board on the heating stage, electrically connecting pats of the microcomputer 7 and the lands on the multi-layer circuit board 1 with gold wires 9 by the ultrasonic wire-bonding, dispensing the solder paste of 3.5 parts of Ag, 0.3 part of Cu, and 96.2 parts of Sn by weight as a conductive material 10 to the lands on the multi-layer circuit board 1, placing parts such as resistors 11 and capacitors 12 on the multi-layer circuit board 1, placing the multi-layer circuit board 1 on the solder-printed side of an assembly of the supporting material and the compound metallic material 2, melting solder (junction 5) and the conductive material 10 at 270° C. by the infrared reflow equipment, solidifying thereof to make electric connections between the electronic parts (resistors 11 and capacitors 12) and the multi-layer circuit board 1, connecting terminals 15, the transistor 8, and the diode 13 to the multi-layer circuit board with Al wires (as wire 14) at a room temperature by ultrasonic wire bonding, applying the packaging resin component 4 which contains 63% by volume of silica filler as an inorganic filling material and gels in 30 seconds at 180° C., and molding the resin component 4 at a mold temperature of 180° C. and a transfer pressure of 7 MPa for three minutes by a low-pressure transfer-molding. The characteristics of the packaging resin component after hardening are 3 GPa (as the modulus of elasticity at a room temperature), 16 ppm/° C. (as the coefficient of line expansion), and 150° C. (as the glass transition temperature).

We tested this prepared electronic circuit device for warpage, air tightness, moldability, mass productivity, malfunction, separation, and cracks after a thermal shock of 2000 cycles, separation, malfunction, and heat radiation after dipping in oil at 140° C. for 2000 hours. Table 1 lists the result of this test.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, as this compound metallic material is strongly bonded to the packing material, no separation will occur between the compound metallic material and the packing material. Further, the use of the ceramic multi-layer circuit board has an effect to increase the thermal conductivity and improve the heat radiation property.

Embodiment 4

The electronic circuit device of Embodiment 4 has a structure shown in FIG. 1. Referring to FIG. 1, the multi-layer circuit board 1 is a 6-layer glass BT resin multi-layer circuit board (50 mm×40 mm). The outermost layer of the board is a copper sheet plated with nickel of 5 μm thick. We prepared the compound metallic material 2 by mixing copper powder and $Cu_2O$ powder, cold-pressing the mixture, and sintering it at 950° C. for three hours. The resulting compound metallic material is 50 mm long×40 mm wide× 0.7 mm thick containing 70% by volume of copper and 30% by volume of $Cu_2O$. The surface roughness (Ra) is 0.2 in 40% or more of the surface area of the compound metallic material and the void content is 6.5%. We prepared an electronic circuit device by welding the compound metallic material 2 to a copper supporting material 3 (junction 6), printing solder (junction 5) of 3.5 parts of Ag, 0.3 part of Cu, and 96.2 parts of Sn by weight on the compound metallic material, dispensing silver paste in place on the multi-layer circuit board to mark locations of a bare-chip microcomputer 7 containing memory, a transistor 8, and a diode 13, placing the microcomputer 7, a transistor 8, and a diode 13 on the locations, hardening the silver paste at 150° C. for one hour for adhesion, heating the microcomputer 7 containing memory up to 200° C. from the circuit side of the multi-layer circuit board on the heating stage, electrically connecting pats of the microcomputer 7 and the lands on the multi-layer circuit board 1 with gold wires 9 by the ultrasonic wire-bonding, dispensing the solder paste of 3.5 parts of Ag, 0.3 part of Cu, and 96.2 parts of Sn by weight as a conductive material 10 to the lands on the multi-layer circuit board 1, placing parts such as resistors 11 and capacitors 12 on the multi-layer circuit board 1, placing the multi-layer circuit board 1 on the solder-printed side of an assembly of the supporting material and the compound metallic material 2, melting solder (junction 5) and the conductive material 10 at 270° C. by the infrared reflow equipment, solidifying thereof to make electric connections between the electronic parts (resistors 11 and capacitors 12) and the multi-layer circuit board 1, connecting terminals 15, the transistor 8, and the diode 13 to the multi-layer circuit board with Al wires (as wire 14) at a room temperature by ultrasonic wire bonding, applying the packaging resin component 4 which contains 63% by volume of silica filler as an inorganic filling material and gels in 30 seconds at 180° C., and molding the resin component 4 at a mold temperature of 180° C. and a transfer pressure of 7 MPa for three minutes by a low-pressure transfer-molding. The characteristics of the packaging resin component after hardening are 3 GPa (as the modulus of elasticity at a room temperature), 16 ppm/° C. (as the coefficient of line expansion), and 150° C. (as the glass transition temperature).

We tested this prepared electronic circuit device for warpage, air tightness, moldability, mass productivity, malfunction, separation, and cracks after a thermal shock of 2000 cycles, separation, malfunction, and heat radiation after dipping in oil at 140° C. for 2000 hours. Table 1 lists the result of this test.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, this compound metallic material is strongly bonded to the packing material and has an effect to suppress a separation of parts. Further, the use of a metallic material containing copper in major proportions has an effect to improve the heat radiation property.

Embodiment 5

The electronic circuit device of Embodiment 5 has a structure shown in FIG. 1. Referring to FIG. 1, the multi-layer circuit board 1 is a 6-layer glass BT resin multi-layer circuit board (50 mm×40 mm). The outermost layer of the board is a copper sheet plated with nickel of 5 μm thick. We prepared the compound metallic material 2 by mixing copper powder and $Cu_2O$ powder, cold-pressing the mixture, and sintering it at 950° C. for three hours. The resulting compound metallic material is 50 mm long×40 mm wide× 0.7 mm thick containing 70% by volume of copper and 30% by volume of $Cu_2O$. The surface roughness (Ra) is 0.2 in 40% or more of the surface area of the compound metallic material and the void content is 6.5%. We prepared an electronic circuit device by welding the compound metallic material 2 to an aluminum supporting material 3 (junction 6), printing solder (junction 5) of 3.5 parts of Ag, 0.3 part of Cu, and 96.2 parts of Sn by weight on the compound metallic material, dispensing silver paste in place on the multi-layer circuit board to mark locations of a bare-chip microcomputer 7 containing memory, a transistor 8, and a diode 13, placing the microcomputer 7, a transistor 8, and a diode 13 on the locations, hardening the silver paste at 150° C. for one hour for adhesion, heating the microcomputer 7 containing memory up to 200° C. from the circuit side of the multi-layer circuit board on the heating stage, electrically connecting pats of the microcomputer 7 and the lands on the multi-layer circuit board 1 with gold wires 9 by the ultrasonic wire-bonding, dispensing the solder paste of 3.5 parts of Ag, 0.3 part of Cu, and 96.2 parts of Sn by weight as a conductive material 10 to the lands on the multi-layer circuit board 1, placing parts such as resistors 11 and capacitors 12 on the multi-layer circuit board 1, placing the multi-layer circuit board 1 on the solder-printed side of an assembly of the supporting material and the compound metallic material 2, melting solder (junction 5) and the conductive material 10 at 270° C. by the infrared reflow equipment, solidifying thereof to make electric connections between the electronic parts (resistors 11 and capacitors 12) and the multi-layer circuit board 1, connecting terminals 15, the transistor 8, and the diode 13 to the multi-layer circuit board with Al wires (as wire 14) at a room temperature by ultrasonic wire bonding, applying the packaging resin component 4 which contains 80% by volume of silica filler as an inorganic filling material and gels in 30 seconds at 180° C., and molding the resin component 4 at a mold temperature of 180° C. and a transfer pressure of 7 MPa for three minutes by a low-pressure transfer-molding. The characteristics of the packaging resin component after hardening are 3 GPa (as the modulus of elasticity at a room temperature), 8 ppm/° C. (as the coefficient of line expansion), and 120° C. (as the glass transition temperature).

We tested this prepared electronic circuit device for warpage, air tightness, moldability, mass productivity, malfunction, separation, and cracks after a thermal shock of 2000 cycles, separation, malfunction, and heat radiation after dipping in oil at 140° C. for 2000 hours. Table 1 lists the result of this test.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, this compound metallic material is strongly bonded to the packing material and has an effect to suppress a separation of parts. The packing resin component containing 75% or more by volume of inorganic filling material can improve its oil resistance.

Embodiment 6

The electronic circuit device of Embodiment 6 has a structure shown in FIG. 1. Referring to FIG. 1, the multi-layer circuit board 1 is a 6-layer glass BT resin multi-layer circuit board (50 mm×40 mm). The outermost layer of the board is a copper sheet plated with nickel of 5 μm thick. We prepared the compound metallic material 2 by mixing copper powder and $Cu_2O$ powder, cold-pressing the mixture, and sintering it at 950° C. for three hours. The resulting compound metallic material is 55 mm long×45 mm wide× 0.7 mm thick containing 70% by volume of copper and 30% by volume of $Cu_2O$. The surface roughness (Ra) is 0.2 in 40% or more of the surface area of the compound metallic material and the void content is 6.5%. We prepared an electronic circuit device by welding the compound metallic material 2 to an aluminum supporting material 3 (junction 6), printing solder (junction 5) of 3.5 parts of Ag, 0.3 part of Cu, and 96.2 parts of Sn by weight on the compound metallic material, dispensing silver paste in place on the multi-layer circuit board to mark locations of a bare-chip microcomputer 7 containing memory, a transistor 8, and a diode 13, placing the microcomputer 7, a transistor 8, and a diode 13 on the locations, hardening the silver paste at 150° C. for one hour for adhesion, heating the microcomputer 7 containing memory up to 200° C. from the circuit side of the multi-layer circuit board on the heating stage, electrically connecting pats of the microcomputer 7 and the lands on the multi-layer circuit board 1 with gold wires 9 by the ultrasonic wire-bonding, dispensing the solder paste of 3.5 parts of Ag, 0.3 part of Cu, and 96.2 parts of Sn by weight as a conductive material 10 to the lands on the multi-layer circuit board 1, placing parts such as resistors 11 and capacitors 12 on the multi-layer circuit board 1, placing the multi-layer circuit board 1 on the solder-printed side of an assembly of the supporting material and the compound metallic material 2, melting solder (junction 5) and the conductive material 10 at 270° C. by the infrared reflow equipment, solidifying thereof to make electric connections between the electronic parts (resistors 11 and capacitors 12) and the multi-layer circuit board 1, connecting terminals 15, the transistor 8, and the diode 13 to the multi-layer circuit board with Al wires (as wire 14) at a room temperature by ultrasonic wire bonding, applying the packaging resin component 4 which contains 63% by volume of silica filler as an inorganic filling material and gels in 30 seconds at 180° C., and molding the resin component 4 at a mold temperature of 180° C. and a transfer pressure of 7 MPa for three minutes by a low-pressure transfer-molding. The characteristics of the packaging resin component after hardening are 3 GPa (as the modulus of elasticity at a room temperature), 16 ppm/° C. (as the coefficient of line expansion), and 150° C. (as the glass transition temperature).

We tested this prepared electronic circuit device for warpage, air tightness, moldability, mass productivity, malfunction, separation, and cracks after a thermal shock of 2000 cycles, separation, malfunction, and heat radiation after dipping in oil at 140° C. for 2000 hours. Table 1 lists the result of this test.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, this compound metallic material is strongly bonded to the packing material and has an effect to suppress a separation of parts. Furthermore, as the compound metallic material made from copper and copper oxide is greater than the multi-layer circuit board, stresses will converge on the compound metallic material rather than the multi-layer circuit board. This can prolong the lives of elements connected to the multi-layer circuit board.

Embodiment 7

The electronic circuit device of Embodiment 7 has a structure shown in FIG. 1. Referring to FIG. 1, the multi-layer circuit board 1 is a 6-layer glass BT resin multi-layer circuit board (50 mm×40 mm). We prepared the compound metallic material 2 by mixing copper powder and $Cu_2O$ powder, cold-pressing the mixture, and sintering it at 950° C. for three hours. The resulting compound metallic material is 50 mm long×40 mm wide×0.7 mm thick containing 70% by volume of copper and 30% by volume of $Cu_2O$. The surface roughness (Ra) is 0.2 in 40% or more of the surface area of the compound metallic material and the void content is 6.5%. We prepared an electronic circuit device by welding the compound metallic material 2 to an aluminum supporting material 3 (junction 6), printing thermosetting resin XNR1244 (fabricated by Nagase ChemTeck) on the compound metallic material, dispensing silver paste in place on the multi-layer circuit board to mark locations of a bare-chip microcomputer 7 containing memory, a transistor 8, and a diode 13, placing the microcomputer 7, a transistor 8, and a diode 13 on the locations, hardening the silver paste at 150° C. for one hour for adhesion, heating the microcomputer 7 containing memory up to 200° C. from the circuit side of the multi-layer circuit board on the heating stage, electrically connecting pats of the microcomputer 7 and the lands on the multi-layer circuit board 1 with gold wires 9 by the ultrasonic wire-bonding, dispensing the solder paste of 3.5 parts of Ag, 0.3 part of Cu, and 96.2 parts of Sn by weight as a conductive material 10 to the lands on the multi-layer circuit board 1, placing parts such as resistors 11 and capacitors 12 on the multi-layer circuit board 1, melting solder (junction 5) and the conductive material 10 at 270° C. by the infrared reflow equipment, solidifying thereof to make electric connections between the electronic parts (resistors 11 and capacitors 12) and the multi-layer circuit board 1, placing the multi-layer circuit board 1 on the thermosetting adhesive of an assembly of the prepared supporting material 3 and the compound metallic material 2, hardening thereof at 150° C. for 30 minutes, connecting terminals 15, the transistor 8, and the diode 13 to the multi-layer circuit board with Al wires (as wire 14) at a room temperature by ultrasonic wire bonding, applying the packaging resin component 4 which contains 63% by volume of silica filler as an inorganic filling material and gels in 30 seconds at 180° C., and molding the resin component 4 at a mold temperature of 180° C. and a transfer pressure of 7 MPa for three minutes by a low-pressure transfer-molding. The characteristics of the packaging resin component after hardening are 3 GPa (as the modulus of elasticity at a room temperature), 16 ppm/° C. (as the coefficient of line expansion), and 150° C. (as the glass transition temperature).

We tested this prepared electronic circuit device for warpage, air tightness, moldability, mass productivity, malfunction, separation, and cracks after a thermal shock of 2000 cycles, separation, malfunction, and heat radiation after dipping in oil at 140° C. for 2000 hours. Table 1 lists the result of this test.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, this compound metallic material is strongly bonded to the packing material and has an effect to suppress a separation of parts. Furthermore, the organic adhesive used to bond the compound metallic material to the multi-layer circuit board has an effect to release the stresses and prevent parts separation.

Embodiment 8

The electronic circuit device of Embodiment 8 has a structure shown in FIG. 1. Referring to FIG. 1, the multi-layer circuit board 1 is a 6-layer glass BT resin multi-layer circuit board (50 mm×40 mm). The outermost layer of the board is a copper sheet plated with nickel of 5 μm thick. We prepared the compound metallic material 2 by mixing copper powder and $Cu_2O$ powder, cold-pressing the mixture, and sintering it at 950° C. for three hours. The resulting compound metallic material is 50 mm long×40 mm wide× 0.7 mm thick containing 70% by volume of copper and 30% by volume of $Cu_2O$. The surface roughness (Ra) is 0.2 in 40% or more of the surface area of the compound metallic material and the void content is 6.5%. We prepared an electronic circuit device by bonding the compound metallic material 2 to an aluminum supporting material 3 with thermosetting resin XNR1244 (fabricated by Nagase ChemTeck), hardening thereof at 150° C. for 30 minutes (junction 6), printing solder (junction 5) of 3.5 parts of Ag, 0.3 part of Cu, and 96.2 parts of Sn by weight on the compound metallic material, dispensing silver paste in place on the multi-layer circuit board to mark locations of a bare-chip microcomputer 7 containing memory, a transistor 8, and a diode 13, placing the microcomputer 7, a transistor 8, and a diode 13 on the locations, hardening the silver paste at 150° C. for one hour for adhesion, heating the microcomputer 7 containing memory up to 200° C. from the circuit side of the multi-layer circuit board on the heating stage, electrically connecting pats of the microcomputer 7 and the lands on the multi-layer circuit board 1 with gold wires 9 by the ultrasonic wire-bonding, dispensing the solder paste of 3.5 parts of Ag, 0.3 part of Cu, and 96.2 parts of Sn by weight as a conductive material 10 to the lands on the multi-layer circuit board 1, placing parts such as resistors 11 and capacitors 12 on the multi-layer circuit board 1, placing the multi-layer circuit board 1 on the solder-printed side of an assembly of the supporting material and the compound metallic material 2, melting solder (junction 5) and the conductive material 10 at 270° C. by the infrared reflow equipment, solidifying thereof to make electric connections between the electronic parts (resistors 11 and capacitors 12) and the multi-layer circuit board 1, connecting terminals 15, the transistor 8, and the diode 13 to the multi-layer circuit board with Al wires (as wire 14) at a room temperature by ultrasonic wire bonding, applying the packaging resin component 4 which contains 63% by volume of silica filler as an inorganic filling material and gels in 30 seconds at 180° C., and molding the resin component 4 at a mold temperature of 180° C. and a transfer pressure of 7 MPa for three minutes by a low-pressure transfer-molding. The characteristics of the packaging resin component after hardening are 3 GPa (as the modulus of elasticity at a room temperature), 16 ppm/° C. (as the coefficient of line expansion), and 150° C. (as the glass transition temperature).

We tested this prepared electronic circuit device for warpage, air tightness, moldability, mass productivity, malfunction, separation, and cracks after a thermal shock of 2000 cycles, separation, malfunction, and heat radiation after dipping in oil at 140° C. for 2000 hours. Table 1 lists the result of this test.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, the organic adhesive used to bond the compound metallic material to the supporting material has an effect to release the stresses and prevent parts separation.

Embodiment 9

The electronic circuit device of Embodiment 9 has a structure shown in FIG. 1. Referring to FIG. 1, the multi-layer circuit board 1 is a 6-layer ceramic multi-layer circuit board (50 mm×40 mm). We prepared the compound metallic material 2 by mixing copper powder and $Cu_2O$ powder, cold-pressing the mixture, and sintering it at 950° C. for three hours. The resulting compound metallic material is 55 mm long×45 mm wide×0.7 mm thick containing 70% by volume of copper and 30% by volume of $Cu_2O$. The surface roughness (Ra) is 0.2 in 40% or more of the surface area of the compound metallic material and the void content is 6.5%. We prepared an electronic circuit device by bonding the compound metallic material 2 to a copper supporting material 3 with thermosetting resin XNR1244 (fabricated by Nagase ChemTeck), hardening thereof at 150° C. for 30 minutes (junction 6), printing thermosetting resin XNR1244 (fabricated by Nagase ChemTeck) on the compound metallic material 2, dispensing silver paste in place on the multi-layer circuit board 1 to mark locations of a bare-chip microcomputer 7 containing memory, a transistor 8, and a diode 13, placing the microcomputer 7, a transistor 8, and a diode 13 on the locations, hardening the silver paste at 150° C. for one hour for adhesion, heating the microcomputer 7 containing memory up to 200° C. from the circuit side of the multi-layer circuit board on the heating stage, electrically connecting pats of the microcomputer 7 and the lands on the multi-layer circuit board 1 with gold wires 9 by the ultrasonic wire-bonding, dispensing the solder paste of 3.5 parts of Ag, 0.3 part of Cu, and 96.2 parts of Sn by weight as a conductive material 10 to the lands on the multi-layer circuit board 1, placing parts such as resistors 11 and capacitors 12 on the multi-layer circuit board 1, melting solder (junction 5) and the conductive material 10 at 270° C. by the infrared reflow equipment, solidifying thereof to make electric connections between the electronic parts (resistors 11 and capacitors 12) and the multi-layer circuit board 1, placing the multi-layer circuit board 1 on the thermosetting adhesive of the assembly of the prepared supporting material 3 and the compound metallic material 2, connecting terminals 15, the transistor 8, and the diode 13 to the multi-layer circuit board 1 with Al wires (as wire 14) at a room temperature by ultrasonic wire bonding, applying the packaging resin component 4 which contains 80% by volume of silica filler as an inorganic filling material and gels in 30 seconds at 180° C., and molding the resin component 4 at a mold temperature of 180° C. and a transfer pressure of 7 MPa for three minutes by a low-pressure transfer-molding. The characteristics of the packaging resin component after hardening are 3 GPa (as the modulus of elasticity at a room temperature), 8 ppm/° C. (as the coefficient of line expansion), and 120° C. (as the glass transition temperature).

We tested this prepared electronic circuit device for warpage, air tightness, moldability, mass productivity, malfunction, separation, and cracks after a thermal shock of 2000 cycles, separation, malfunction, and heat radiation after dipping in oil at 140° C. for 2000 hours. Table 1 lists the result of this test.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, the use of the ceramic multi-layer circuit board has an effect to increase the thermal conductivity and improve the heat radiation property. Further, the use of a metallic material containing copper in major proportions has an effect to improve the heat radiation property. The packing resin component containing 75% or more by volume of inorganic filling material can improve its oil resistance. As the compound metallic material made from copper and copper oxide is greater than the multi-layer circuit board, stresses will converge on the compound metallic material rather than the multi-layer circuit board. This can prolong the lives of elements connected to the multi-layer circuit board. The organic adhesive used to bond the compound metallic material to the multi-layer circuit board has an effect to release the stresses and prevent parts separation. Furthermore, the organic adhesive used to bond the compound metallic material to the supporting material has an effect to release the stresses and prevent parts separation.

Embodiment 10

The electronic circuit device of Embodiment 10 has a structure shown in FIG. 1. Referring to FIG. 1, the multi-layer circuit board 1 is a 6-layer ceramic multi-layer circuit board (50 mm×40 mm). We prepared the compound metallic material 2 by mixing copper powder and $Cu_2O$ powder, cold-pressing the mixture, and sintering it at 950° C. for three hours. The resulting compound metallic material is 55 mm long×45 mm wide×0.7 mm thick containing 70% by volume of copper and 30% by volume of $Cu_2O$. The surface roughness (Ra) is 0.2 in 40% or more of the surface area of the compound metallic material and the void content is 1.0%. We prepared an electronic circuit device by bonding the compound metallic material 2 to a copper supporting material 3 with thermosetting resin XNR1244 (fabricated by Nagase ChemTeck), hardening thereof at 150° C. for 30 minutes (junction 6), printing thermosetting resin XNR1244 (fabricated by Nagase ChemTeck) on the compound metallic material 2, dispensing silver paste in place on the multi-layer circuit board 1 to mark locations of a bare-chip microcomputer 7 containing memory, a transistor 8, and a diode 13, placing the microcomputer 7, a transistor 8, and a diode 13 on the locations, hardening the silver paste at 150° C. for one hour for adhesion, heating the microcomputer 7 containing memory up to 200° C. from the circuit side of the multi-layer circuit board on the heating stage, electrically connecting pats of the microcomputer 7 and the lands on the multi-layer circuit board 1 with gold wires 9 by the ultrasonic wire-bonding, dispensing the solder paste of 3.5 parts of Ag, 0.3 part of Cu, and 96.2 parts of Sn by weight as a conductive material 10 to the lands on the multi-layer circuit board 1, placing parts such as resistors 11 and capacitors 12 on the multi-layer circuit board 1, melting solder (junction 5) and the conductive material 10 at 270° C. by the infrared reflow equipment, solidifying thereof to make electric connections between the electronic parts (resistors 11 and capacitors 12) and the multi-layer circuit board 1, placing the multi-layer circuit board 1 on the thermosetting adhesive of the assembly of the prepared supporting material 3 and the compound metallic material 2, connecting terminals 15, the transistor 8, and the diode 13 to the multi-layer circuit board 1 with Al wires (as wire 14) at a room temperature by ultrasonic wire bonding, applying the packaging resin component 4 which contains 80% by volume of silica filler as an inorganic filling material and gels, in 30 seconds at 180° C., and molding the resin component 4 at a mold temperature of 180° C. and a transfer pressure of 7 MPa for three minutes by a low-pressure transfer-molding. The characteristics of the packaging resin component after hardening are 3 GPa (as the modulus of elasticity at a room temperature), 8 ppm/° C. (as the coefficient of line expansion), and 120° C. (as the glass transition temperature).

We tested this prepared electronic circuit device for warpage, air tightness, moldability, mass productivity, malfunction, separation, and cracks after a thermal shock of 2000 cycles, separation, malfunction, and heat radiation after dipping in oil at 140° C. for 2000 hours. Table 1 lists the result of this test.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, the use of the ceramic multi-layer circuit board has an effect to increase the thermal conductivity and improve the heat radiation property. Further, the use of a metallic material containing copper in major proportions has an effect to improve the heat radiation property. The packing resin component containing 75% or more by volume of inorganic filling material can improve its oil resistance. As the compound metallic material made from copper and copper oxide is greater than the multi-layer circuit board, stresses will converge on the compound metallic material rather than the multi-layer circuit board. This can prolong the lives of elements connected to the multi-layer circuit board. The organic adhesive used to bond the compound metallic material to the multi-layer circuit board has an effect to release the stresses and prevent parts separation. The organic adhesive used to bond the compound metallic material to the supporting material has an effect to release the stresses and prevent parts separation. Furthermore, as the compound metallic material has the void content of 1 to 50% by volume, the metallic material is high in thermal conductivity and low in modulus of elasticity. This has an effect to improve heat radiation and reliability.

Embodiment 11

The electronic circuit device of Embodiment 11 has a structure shown in FIG. 1. Referring to FIG. 1, the multi-layer circuit board 1 is a 6-layer ceramic multi-layer circuit board (50 mm×40 mm). We prepared the compound metallic material 2 by mixing copper powder, $Cu_2O$ powder, and tungsten hydride, cold-pressing the mixture, and sintering it at 1000° C. for three hours, plating the sintered metallic material with copper of 20 μm thick, and polishing its surfaces. The resulting compound metallic material is 55 mm long×45 mm wide×0.7 mm thick containing 65% by volume of copper and 30% by volume of $Cu_2O$. The surface roughness (Ra) is 0.2 in 40% or more of the surface area of the compound metallic material and the void content is 50%. We prepared an electronic circuit device by bonding the compound metallic material 2 to a copper supporting material 3 with thermosetting resin XNR1244 (fabricated by Nagase ChemTeck), hardening thereof at 150° C. for 30 minutes (junction 6), printing thermosetting resin XNR1244 (fabricated by Nagase ChemTeck) on the compound metallic material 2, dispensing silver paste in place on the multi-layer circuit board 1 to mark locations of a bare-chip microcomputer 7 containing memory, a transistor 8, and a diode 13, placing the microcomputer 7, a transistor 8, and a diode 13 on the locations, hardening the silver paste at 150° C. for one hour for adhesion, heating the microcomputer 7 containing memory up to 200° C. from the circuit side of the multi-layer circuit board on the heating stage, electrically connecting pats of the microcomputer 7 and the lands on the multi-layer circuit board 1 with gold wires 9 by the ultrasonic wire-bonding, dispensing the solder paste of 3.5 parts of Ag, 0.3 part of Cu, and 96.2 parts of Sn by weight as a conductive material 10 to the lands on the multi-layer circuit board 1, placing parts such as resistors 11 and capacitors 12 on the multi-layer circuit board 1, melting solder (junction 5) and the conductive material 10 at 270° C. by the infrared reflow equipment, solidifying thereof to make electric connections between the electronic parts (resistors 11 and capacitors 12) and the multi-layer circuit board 1, placing the multi-layer circuit board 1 on the thermosetting adhesive of the assembly of the prepared supporting material 3 and the compound metallic material 2, connecting terminals 15, the transistor 8, and the diode 13 to the multi-layer circuit board 1 with Al wires (as wire 14) at a room temperature by ultrasonic wire bonding, applying the packaging resin component 4 which contains 80% by volume of silica filler as an inorganic filling material and gels in 30 seconds at 180° C., and molding the resin component 4 at a mold temperature of 180° C. and a transfer pressure of 7 MPa for three minutes by a low-pressure transfer-molding. The characteristics of the packaging resin component after hardening are 3 GPa (as the modulus of elasticity at a room temperature), 8 ppm/° C. (as the coefficient of line expansion), and 120° C. (as the glass transition temperature).

We tested this prepared electronic circuit device for warpage, air tightness, moldability, mass productivity, malfunction, separation, and cracks after a thermal shock of 2000 cycles, separation, malfunction, and heat radiation after dipping in oil at 140° C. for 2000 hours. Table 1 lists the result of this test.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, the use of the ceramic multi-layer circuit board has an effect to increase the thermal conductivity and improve the heat radiation property. Further, the use of a metallic material containing copper in major proportions has an effect to improve the heat radiation property. The packing resin component containing 75% or more by volume of inorganic filling material can improve its oil resistance. As the compound metallic material made from copper and copper oxide is greater than the multi-layer circuit board, stresses will converge on the compound metallic material rather than the multi-layer circuit board. This can prolong the lives of elements connected to the multi-layer circuit board. The organic adhesive used to bond the compound metallic material to the multi-layer circuit board has an effect to release the stresses and prevent parts separation. The organic adhesive used to bond the compound metallic material to the supporting material has an effect to release the stresses and prevent parts separation. Furthermore, as the compound metallic material has the void content of 1 to 50% by volume, the metallic material is high in thermal conductivity and low in modulus of elasticity. This has an effect to improve heat radiation and reliability.

Embodiment 12

The electronic circuit device of Embodiment 12 has a structure shown in FIG. 1. Referring to FIG. 1, the multi-layer circuit board 1 is a 6-layer ceramic multi-layer circuit board (50 mm×40 mm). We prepared the compound metallic material 2 by mixing copper powder and $Cu_2O$ powder, cold-pressing the mixture, and sintering it at 950° C. for three hours, plating the sintered metallic material with copper of 10 μm thick, and polishing its surfaces. The resulting compound metallic material is 55 mm long×45 mm wide×0.7 mm thick containing 70% by volume of copper and 30% by volume of $Cu_2O$. The surface roughness (Ra) is 0.01 in 40% or more of the surface area of the compound metallic material and the void content is 6.5%. We prepared an electronic circuit device by bonding the compound metallic material 2 to a copper supporting material 3 with thermosetting resin XNR1244 (fabricated by Nagase ChemTeck), hardening thereof at 150° C. for 30 minutes (junction 6), printing thermosetting resin XNR1244 (fabricated by Nagase ChemTeck) on the compound metallic material 2, dispensing silver paste in place on the multi-layer circuit board 1 to mark locations of a bare-chip microcomputer 7 containing memory, a transistor 8, and a diode 13, placing the microcomputer 7, a transistor 8, and a diode 13 on the locations, hardening the silver paste at 150° C. for one hour for adhesion, heating the microcomputer 7 containing memory up to 200° C. from the circuit side of the multi-layer circuit board on the heating stage, electrically connecting pats of the microcomputer 7 and the lands on the multi-layer circuit board 1 with gold wires 9 by the ultrasonic wire-bonding, dispensing the solder paste of 3.5 parts of Ag, 0.3 part of Cu, and 96.2 parts of Sn by weight as a conductive material 10 to the lands on the multi-layer circuit board 1, placing parts such as resistors 11 and capacitors 12 on the multi-layer circuit board 1, melting solder (junction 5) and the conductive material 10 at 270° C. by the infrared reflow equipment, solidifying thereof to make electric connections between the electronic parts (resistors 11 and capacitors 12) and the multi-layer circuit board 1, placing the multi-layer circuit board 1 on the thermosetting adhesive of the assembly of the prepared supporting material 3 and the compound metallic material 2, connecting terminals 15, the transistor 8, and the diode 13 to the multi-layer circuit board 1 with Al wires (as wire 14) at a room temperature by ultrasonic wire bonding, applying the packaging resin component 4 which contains 80% by volume of silica filler as an inorganic filling material and gels in 30 seconds at 180° C., and molding the resin component 4 at a mold temperature of 180° C. and a transfer pressure of 7 MPa for three minutes by a low-pressure transfer-molding. The characteristics of the packaging resin component after hardening are 3 GPa (as the modulus of elasticity at a room temperature), 8 ppm/° C. (as the coefficient of line expansion), and 120° C. (as the glass transition temperature).

We tested this prepared electronic circuit device for warpage, air tightness, moldability, mass productivity, malfunction, separation, and cracks after a thermal shock of 2000 cycles, separation, malfunction, and heat radiation after dipping in oil at 140° C. for 2000 hours. Table 1 lists the result of this test.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, the use of the ceramic multi-layer circuit board has an effect to increase the thermal conductivity and improve the heat radiation property. Further, the use of a metallic material containing copper in major proportions has an effect to improve the heat radiation property. The packing resin component containing 75% or more by volume of inorganic filling material can improve its oil resistance. As the compound metallic material made from copper and copper oxide is greater than the multi-layer circuit board, stresses will converge on the compound metallic material rather than the multi-layer circuit board. This can prolong the lives of elements connected to the multi-layer circuit board. The organic adhesive used to bond the compound metallic material to the multi-layer circuit board has an effect to release the stresses and prevent parts separation. The organic adhesive used to bond the compound metallic material to the supporting material has an effect to release the stresses and prevent parts separation.

Embodiment 13

The electronic circuit device of Embodiment 13 has a structure shown in FIG. 1. Referring to FIG. 1, the multi-layer circuit board 1 is a 6-layer ceramic multi-layer circuit board (50 mm×40 mm). We prepared the compound metallic material 2 by mixing copper powder and $Cu_2O$ powder, cold-pressing the mixture, and sintering it at 950° C. for three hours. The resulting compound metallic material is 55 mm long×45 mm wide×0.7 mm thick containing 70% by volume of copper and 30% by volume of $Cu_2O$. The surface roughness (Ra) is 500 in 40% or more of the surface area of the compound metallic material and the void content is 6.5%. We prepared an electronic circuit device by bonding the compound metallic material 2 to a copper supporting material 3 with thermosetting resin XNR1244 (fabricated by Nagase ChemTeck), hardening thereof at 150° C. for 30 minutes (junction 6), printing thermosetting resin XNR1244 (fabricated by Nagase ChemTeck) on the compound metallic material 2, dispensing silver paste in place on the multi-layer circuit board 1 to mark locations of a bare-chip microcomputer 7 containing memory, a transistor 8, and a diode 13, placing the microcomputer 7, a transistor 8, and a diode 13 on the locations, hardening the silver paste at 150° C. for one hour for adhesion, heating the microcomputer 7 containing memory up to 200° C. from the circuit side of the multi-layer circuit board on the heating stage, electrically connecting pats of the microcomputer 7 and the lands on the multi-layer circuit board 1 with gold wires 9 by the ultrasonic wire-bonding, dispensing the solder paste of 3.5 parts of Ag, 0.3 part of Cu, and 96.2 parts of Sn by weight as a conductive material 10 to the lands on the multi-layer circuit board 1, placing parts such as resistors 11 and capacitors 12 on the multi-layer circuit board 1, melting solder (junction 5) and the conductive material 10 at 270° C. by the infrared reflow equipment, solidifying thereof to make electric connections between the electronic parts (resistors 11 and capacitors 12) and the multi-layer circuit board 1, placing the multi-layer circuit board 1 on the thermosetting adhesive of the assembly of the prepared supporting material 3 and the compound metallic material 2, connecting terminals 15, the transistor 8, and the diode 13 to the multi-layer circuit board 1 with Al wires (as wire 14) at a room temperature by ultrasonic wire bonding, applying the packaging resin component 4 which contains 80% by volume of silica filler as an inorganic filling material and gels in 30 seconds at 180° C., and molding the resin component 4 at a mold temperature of 180° C. and a transfer pressure of 7 MPa for three minutes by a low-pressure transfer-molding. The characteristics of the packaging resin component after hardening are 3 GPa (as the modulus of elasticity at a room temperature), 8 ppm/° C. (as the coefficient of line expansion), and 120° C. (as the glass transition temperature).

We tested this prepared electronic circuit device for warpage, air tightness, moldability, mass productivity, malfunction, separation, and cracks after a thermal shock of 2000 cycles, separation, malfunction, and heat radiation after dipping in oil at 140° C. for 2000 hours. Table 1 lists the result of this test.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, the use of the ceramic multi-layer circuit board has an effect to increase the thermal conductivity and improve the heat radiation property. Further, the use of a metallic material containing copper in major proportions has an effect to improve the heat radiation property. The packing resin component containing 75% or more by volume of inorganic filling material can improve its oil resistance. As the compound metallic material made from copper and copper oxide is greater than the multi-layer circuit board, stresses will converge on the compound metallic material rather than the multi-layer circuit board. This can prolong the lives of elements connected to the multi-layer circuit board. The organic adhesive used to bond the compound metallic material to the multi-layer circuit board has an effect to release the stresses and prevent parts separation. The organic adhesive used to bond the compound metallic material to the supporting material has an effect to release the stresses and prevent parts separation.

Embodiment 14

The electronic circuit device of Embodiment 14 has a structure shown in FIG. 1. Referring to FIG. 1, the multi-layer circuit board 1 is a 6-layer ceramic multi-layer circuit board (50 mm×40 mm). We prepared the compound metallic material 2 by mixing copper powder and $Cu_2O$ powder, cold-pressing the mixture, and sintering it at 950° C. for three hours. The resulting compound metallic material is 55 mm long×45 mm wide×0.7 mm thick containing 90% by volume of copper and 10% by volume of $Cu_2O$. The surface roughness (Ra) is 0.2 in 40% or more of the surface area of the compound metallic material and the void content is 6.5%. We prepared an electronic circuit device by bonding the compound metallic material 2 to a copper supporting material 3 with thermosetting resin XNR1244 (fabricated by Nagase ChemTeck), hardening thereof at 150° C. for 30 minutes (junction 6), printing thermosetting resin XNR1244 (fabricated by Nagase ChemTeck) on the compound metallic material 2, dispensing silver paste in place on the multi-layer circuit board 1 to mark locations of a bare-chip microcomputer 7 containing memory, a transistor 8, and a diode 13, placing the microcomputer 7, a transistor 8, and a diode 13 on the locations, hardening the silver paste at 150° C. for one hour for adhesion, heating the microcomputer 7 containing memory up to 200° C. from the circuit side of the multi-layer circuit board on the heating stage, electrically connecting pats of the microcomputer 7 and the lands on the multi-layer circuit board 1 with gold wires 9 by the ultrasonic wire-bonding, dispensing the solder paste of 3.5 parts of Ag, 0.3 part of Cu, and 96.2 parts of Sn by weight as a conductive material 10 to the lands on the multi-layer circuit board 1, placing parts such as resistors 11 and capacitors 12 on the multi-layer circuit board 1, melting solder (junction 5) and the conductive material 10 at 270° C. by the infrared reflow equipment, solidifying thereof to make electric connections between the electronic parts (resistors 11 and capacitors 12) and the multi-layer circuit board 1, placing the multi-layer circuit board 1 on the thermosetting adhesive of the assembly of the prepared supporting material 3 and the compound metallic material 2, connecting terminals 15, the transistor 8, and the diode 13 to the multi-layer circuit board 1 with Al wires (as wire 14) at a room temperature by ultrasonic wire bonding, applying the packaging resin component 4 which contains 80% by volume of silica filler as an inorganic filling material and gels in 30 seconds at 180° C., and molding the resin component 4 at a mold temperature of 180° C. and a transfer pressure of 7 MPa for three minutes by a low-pressure transfer-molding. The characteristics of the packaging resin component after hardening are 3 GPa (as the modulus of elasticity at a room temperature), 8 ppm/° C. (as the coefficient of line expansion), and 120° C. (as the glass transition temperature).

We tested this prepared electronic circuit device for warpage, air tightness, moldability, mass productivity, malfunction, separation, and cracks after a thermal shock of 2000 cycles, separation, malfunction, and heat radiation after dipping in oil at 140° C. for 2000 hours. Table 1 lists the result of this test.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, the use of the ceramic multi-layer circuit board has an effect to increase the thermal conductivity and improve the heat radiation property. Further, the use of a metallic material containing copper in major proportions has an effect to improve the heat radiation property. The packing resin component containing 75% or more by volume of inorganic filling material can improve its oil resistance. As the compound metallic material made from copper and copper oxide is greater than the multi-layer circuit board, stresses will converge on the compound metallic material rather than the multi-layer circuit board. This can prolong the lives of elements connected to the multi-layer circuit board. The organic adhesive used to bond the compound metallic material to the multi-layer circuit board has an effect to release the stresses and prevent parts separation. The organic adhesive used to bond the compound metallic material to the supporting material has an effect to release the stresses and prevent parts separation. Furthermore, the ratio of copper oxide to the compound metallic material is 10% to 50% by volume has an effect to improve the low modulus of elasticity and high thermal conductivity.

Embodiment 15

The electronic circuit device of Embodiment 15 has a structure shown in FIG. 1. Referring to FIG. 1, the multi-layer circuit board 1 is a 6-layer ceramic multi-layer circuit board (50 mm×40 mm). The outermost layer of the board is a solid wiring pattern plated with nickel of 5 μm thick. We prepared the compound metallic material 2 by mixing copper powder and $Cu_2O$ powder, cold-pressing the mixture, and sintering it at 950° C. for three hours. The resulting compound metallic material is 55 mm long×45 mm wide× 0.7 mm thick containing 50% by volume of copper and 50% by volume of $Cu_2O$. The surface roughness (Ra) is 0.2 in 40% or more of the surface area of the compound metallic material and the void content is 6.5%. We prepared an electronic circuit device by bonding the compound metallic material 2 to a copper supporting material 3 with thermosetting resin XNR1244 (fabricated by Nagase ChemTeck), hardening thereof at 150° C. for 30 minutes (junction 6), printing thermosetting resin XNR1244 (fabricated by Nagase ChemTeck) on the compound metallic material 2, dispensing silver paste in place on the multi-layer circuit board 1 to mark locations of a bare-chip microcomputer 7 containing memory, a transistor 8, and a diode 13, placing the microcomputer 7, a transistor 8, and a diode 13 on the locations, hardening the silver paste at 150° C. for one hour for adhesion, heating the microcomputer 7 containing memory up to 200° C. from the circuit side of the multi-layer circuit board on the heating stage, electrically connecting pats of the microcomputer 7 and the lands on the multi-layer circuit board 1 with gold wires 9 by the ultrasonic wire-bonding, dispensing the solder paste of 3.5 parts of Ag, 0.3 part of Cu, and 96.2 parts of Sn by weight as a conductive material 10 to the lands on the multi-layer circuit board 1, placing parts such as resistors 11 and capacitors 12 on the multi-layer circuit board 1, melting solder (junction 5) and the conductive material 10 at 270° C. by the infrared reflow equipment, solidifying thereof to make electric connections between the electronic parts (resistors 11 and capacitors 12) and the multi-layer circuit board 1, placing the multi-layer circuit board 1 on the thermosetting adhesive of the assembly of the prepared supporting material 3 and the compound metallic material 2, connecting terminals 15, the transistor 8, and the diode 13 to the multi-layer circuit board 1 with Al wires (as wire 14) at a room temperature by ultrasonic wire bonding, applying the packaging resin component 4 which contains 80% by volume of silica filler as an inorganic filling material and gels in 30 seconds at 180° C., and molding the resin component 4 at a mold temperature of 180° C. and a transfer pressure of 7 MPa for three minutes by a low-pressure transfer-molding. The characteristics of the packaging resin component after hardening are 3 GPa (as the modulus of elasticity at a room temperature), 8 ppm/° C. (as the coefficient of line expansion), and 120° C. (as the glass transition temperature).

We tested this prepared electronic circuit device for warpage, air tightness, moldability, mass productivity, malfunction, separation, and cracks after a thermal shock of 2000 cycles, separation, malfunction, and heat radiation after dipping in oil at 140° C. for 2000 hours. Table 1 lists the result of this test.

As described above, the electronic circuit device is a single package which packs the whole multi-layer circuit board. This can reduce the size and warpage of the device and makes the device highly resistant to oil. Further as the multi-layer circuit board and the supporting material are bonded to each other with a compound metallic material made from copper and copper oxide, the circuit device excels in heat radiation. The low modulus of elasticity of this compound metallic material relaxes stresses due to a difference of thermal expansions of the supporting material and the multi-layer circuit board, prevents separation thereof, relaxes stresses of the packing material and the compound metallic material, and consequently prevents cracks in the packing material. Further, the use of the ceramic multi-layer circuit board has an effect to increase the thermal conductivity and improve the heat radiation property. Further, the use of a metallic material containing copper in major proportions has an effect to improve the heat radiation property. The packing resin component containing 75% or more by volume of inorganic filling material can improve its oil resistance. As the compound metallic material made from copper and copper oxide is greater than the multi-layer circuit board, stresses will converge on the compound metallic material rather than the multi-layer circuit board. This can prolong the lives of elements connected to the multi-layer circuit board. The organic adhesive used to bond the compound metallic material to the multi-layer circuit board has an effect to release the stresses and prevent parts separation. The organic adhesive used to bond the compound metallic material to the supporting material has an effect to release the stresses and prevent parts separation. Furthermore, as the surface roughness (Ra) is between 0.01 and 500 μm (including both) in 40% or more of the surface area of said compound metallic material (where Ra is an arithmetic average of roughness defined by JIS B 0660, 1998), the adhesiveness to the packaging resin component is superior and very reliable.

COMPARATIVE EXAMPLE 1

Figure 3:
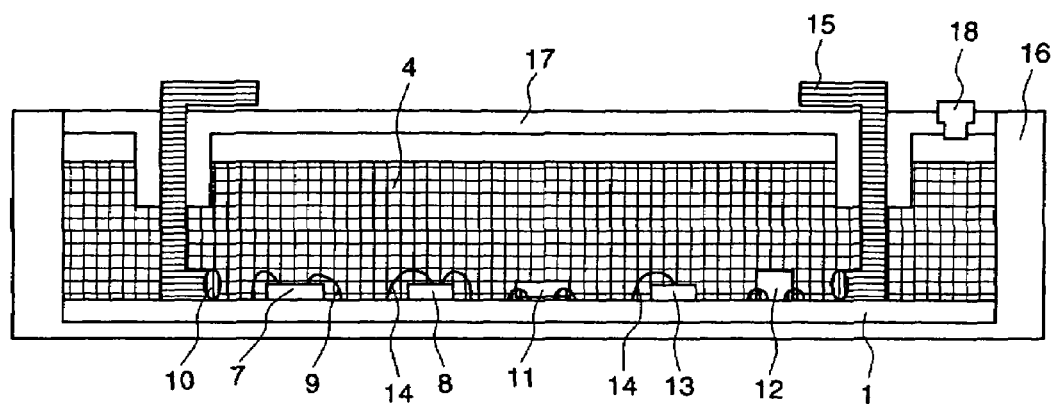
FIG. 3 shows the diagrammatical vertical sectional view of an electronic circuit device which is a comparative example of this invention.

A resin-packaged semiconductor device of Comparative Example 1 has a structure shown in FIG. 3. This example uses a plastic casing 16 incorporating ceramic multi-layer circuit board 1. We prepared this semiconductor device by dispensing solder paste (which starts to melt at 232° C.)

which is an alloy of 5.0% of Pb and 95.0% of Sn (by weight) to mark locations of a microcomputer 7 containing memory, a transistor 8, and a diode 13 on the multilayer circuit board 1, melting the solder paste in the infrared reflow equipment, solidifying thereof to bond the microcomputer 7 containing memory, the transistor 8, and the diode 13 to the multi-layer circuit board 1, heating the microcomputer 7 containing memory up to 200° C. from the circuit side of the multi-layer circuit board on the heating stage, electrically connecting pats of the microcomputer 7 and the lands on the multi-layer circuit board 1 with gold wires 9 by the ultrasonic wire-bonding, and electrically connecting the transistor 8 and the diode 13 to the multi-layer circuit board with Al wires (as wire 14) at a room temperature by ultrasonic wire bonding.

Then we took steps of dispensing solder paste (which starts to melt at about 183° C.) which is an alloy of 37% of Pb and 63% of Sn (by weight) as a conductive material 10 to the lands of parts represented by terminals 15 and resistors 11, and capacitors 12 on the multi-layer circuit board 1, placing the parts (represented by terminals 15 and resistors 11, and capacitors 12) on the multi-layer circuit board 1, mounting a cover block 17 having terminals 15 bonded thereto on the multi-layer circuit board with the terminal ends on the lands of the multi-layer circuit board 1, melting solder paste by the infrared reflow equipment to electrically connect the parts (represented by terminals 15 and resistors 11, and capacitors 12) to the multi-layer circuit board 1, applying a silicone adhesive to areas at which the lid touches the casing, hardening the adhesive in a thermostatic chamber at 150° C. for one hour, injecting silicone gel into the casing through a hole on the lid 17 in a vacuumed status, releasing the pressure to the normal pressure when the gel reaches about 80% of the casing height, hardening the silicone gel at 150° C. for one hour, applying silicone adhesive to the cap 18, applying the cap to the hole on the lid, and hardening the adhesive in the thermostatic chamber at 150° C. for one hour.

We tested this prepared electronic circuit device for warpage, air tightness, moldability, mass productivity, malfunction, separation, and cracks after a thermal shock of 2000 cycles, separation, malfunction, and heat radiation after dipping in oil at 140° C. for 2000 hours. Table 1 lists the result of this test.

This prepared resin-packaged semiconductor device has problems of too much dimensions, long packing time, low mass productivity, and low heat radiation.

COMPARATIVE EXAMPLE 2

Figure 4:
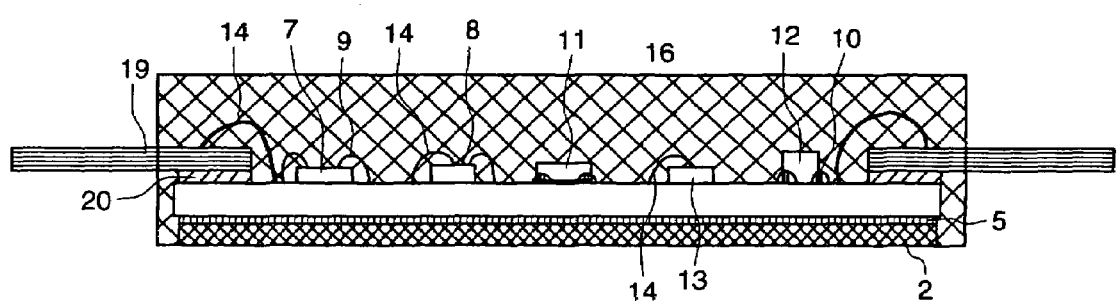
FIG. 4 shows the diagrammatical vertical sectional view of an electronic circuit device which is a comparative example of this invention.

The electronic circuit device of Comparative Example 2 has a structure shown in FIG. 4. Referring to FIG. 4, the multi-layer circuit board 1 is a 6-layer ceramic multi-layer circuit board (50 mm×40 mm). We prepared the compound metallic material 2 by mixing copper powder and $Cu_2O$ powder, cold-pressing the mixture, and sintering it at 950° C. for three hours. The resulting compound metallic material is 55 mm long×45 mm wide×0.7 mm thick containing 70% by volume of copper and 30% by volume of $Cu_2O$. The surface roughness (Ra) is 0.2 in 40% or more of the surface area of the compound metallic material and the void content is 6.5%. We prepared an electronic circuit device by printing thermosetting resin XNR1244 (fabricated by Nagase ChemTeck) on the compound metallic material 2, placing the multi-layer circuit board thereon, hardening thereof at 150° C. for 30 minutes, bonding the outer leads 19 of the copper lead frame to the multi-layer circuit board 1 with epoxy resin adhesive (as adhesive 20), hardening thereof at 150° C. for one hour, dispensing thermosetting silver paste in place on the multi-layer circuit board 1 to mark locations of a bare-chip microcomputer 7 containing memory, a transistor 8, and a diode 13, placing the microcomputer 7, the transistor 8, and the diode 13 on the locations, hardening the thermosetting silver paste at 150° C. for one hour for adhesion, heating the microcomputer 7 containing memory up to 200° C. from the circuit side of the multi-layer circuit board on the heating stage, electrically connecting pats of the microcomputer 7 and the lands on the multi-layer circuit board 1 with gold wires 9 by the ultrasonic wire-bonding, dispensing a solder paste of 37% of Pb and 63% of Sn by weight (which starts to melt at about 183° C.) as a conductive material 10 to the lands on the multi-layer circuit board 1, placing parts such as resistors 11 and capacitors 12 on the multi-layer circuit board 1, melting the conductive material 10 at 240° C. by the infrared reflow equipment, solidifying thereof to make electric connections between the electronic parts (resistors 11 and capacitors 12) and the multi-layer circuit board 1, electrically connecting outer leads 19, the transistor 8, and the diode 13 to the multi-layer circuit board 1 with Al wires (as wire 14) at a room temperature by ultrasonic wire bonding, applying the packaging epoxy resin material which gels in 30 seconds at 180° C., and molding the resin material at a mold temperature of 180° C. and a transfer pressure of 7 MPa for three minutes by a low-pressure transfer-molding. The characteristics of the packaging resin material after hardening are 3 GPa (as the modulus of elasticity at a room temperature), 8 ppm/° C. (as the coefficient of line expansion), and 120° C. (as the glass transition temperature).

We tested this prepared electronic circuit device for warpage, air tightness, moldability, mass productivity, malfunction, separation, and cracks after a thermal shock of 2000 cycles, separation, malfunction, and heat radiation after dipping in oil at 140° C. for 2000 hours. Table 1 lists the result of this test.

This prepared electronic circuit device has a low oil-proof reliability.

COMPARATIVE EXAMPLE 3

The electronic circuit device of Comparative Example 3 has a structure shown in FIG. 1. Referring to FIG. 1, the multi-layer circuit board 1 is a 6-layer ceramic multi-layer circuit board (50 mm×40 mm). Instead of the compound metallic material 2, we used a zirconium ceramic (which is 55 mm long×45 mm wide×0.7 mm thick, the surface roughness (Ra) of 0.2 in 40% or more of the surface area of the compound metallic material and the void content of 1% or less). We prepared an electronic circuit device by bonding the zirconium ceramic to the copper supporting material 3 with thermosetting resin XNR1244 (fabricated by Nagase ChemTeck), hardening thereof at 150° C. for 30 minutes (junction 6), printing thermosetting resin XNR1244 (fabricated by Nagase ChemTeck) on the zirconium ceramic, dispensing thermosetting silver paste in place on the multi-layer circuit board 1 to mark locations of a bare-chip microcomputer 7 containing memory, a transistor 8, and a diode 13, placing the microcomputer 7, the transistor 8, and the diode 13 on the locations, hardening the silver paste at 150° C. for one hour for adhesion, heating the microcomputer 7 containing memory up to 200° C. from the circuit side of the multi-layer circuit board on the heating stage, electrically connecting pats of the microcomputer 7 and the lands on the multi-layer circuit board 1 with gold wires 9 by the ultrasonic wire-bonding, dispensing a solder paste of 3.5 parts of Ag, 0.3 part of Cu, and 96.2 part of Sn by weight (which starts to melt at about 183° C.) as a conductive material 10 to the lands on the multi-layer circuit board 1, placing parts such as resistors 11 and capacitors 12 on the multi-layer circuit board 1, melting the solder (junction 5) and the conductive material 10 at 270° C. by the infrared reflow equipment, solidifying thereof to make electric connections between the electronic parts (resistors 11 and capacitors 12) and the multi-layer circuit board 1, placing the multi-layer circuit board on the thermosetting adhesive of the assembly of the prepared supporting material 3 and the compound metallic material 2, hardening thereof at 150° C. for 30 minutes, electrically connecting terminals 15, the transistor 8, and the diode 13 to the multi-layer circuit board 1 with Al wires (as wire 14) at a room temperature by ultrasonic wire bonding, applying the packaging resin component 4 which contains 80% by volume of silica filler as an inorganic filling material and gels in 30 seconds at 180° C., and molding the resin material at a mold temperature of 180° C. and a transfer pressure of 7 MPa for three minutes by a low-pressure transfer-molding. The characteristics of the packaging resin material after hardening are 3 GPa (as the modulus of elasticity at a room temperature), 8 ppm/° C. (as the coefficient of line expansion), and 120° C. (as the glass transition temperature).

We tested this prepared electronic circuit device for warpage, air tightness, moldability, mass productivity, malfunction, separation, and cracks after a thermal shock of 2000 cycles, separation, malfunction, and heat radiation after dipping in oil at 140° C. for 2000 hours. Table 1 lists the result of this test.

The electronic circuit device which was prepared above had cracks in the packaging resin component after a 2000-cycle thermal shock test. This is because the zirconium ceramic has a high modulus of elasticity and does not release the thermal stresses between the packaging resin component and the multi-layer circuit board.

COMPARATIVE EXAMPLE 4

Figure 5:
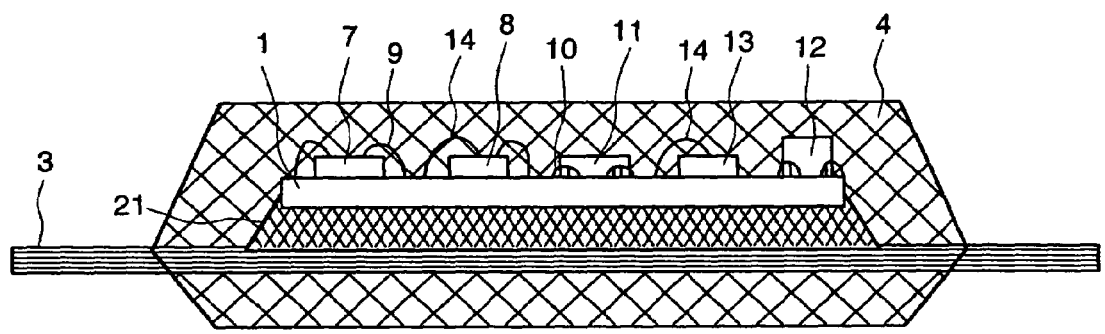
FIG. 5 shows the diagrammatical vertical sectional view of an electronic circuit device which is a comparative example of this invention.
Figure 6:
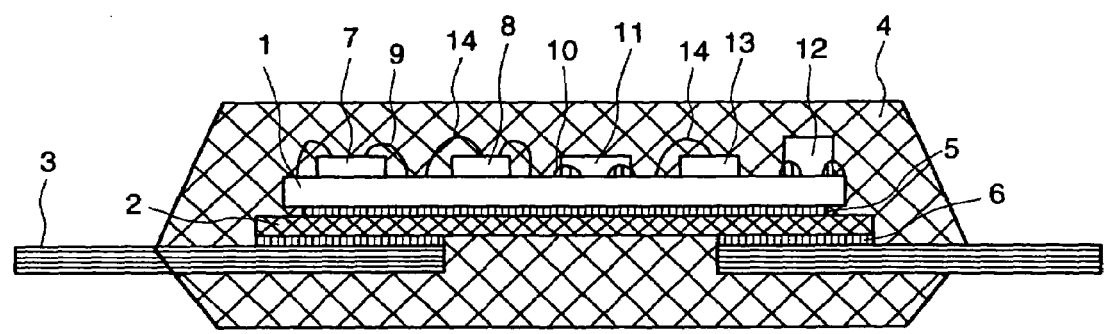
FIG. 6 shows the diagrammatical vertical sectional view of an electronic circuit device which is an embodiment of this invention.

The electronic circuit device of Comparative Example 4 has a structure shown in FIG. 5. Referring to FIG. 5, the multi-layer circuit board 1 is a 6-layer ceramic multi-layer circuit board (50 mm×40 mm). We prepared an electronic circuit device by dispensing thermosetting silver paste in place on the multi-layer circuit board 1 to mark locations of a bare-chip microcomputer 7 containing memory, a transistor 8, and a diode 13, placing the quality-assured microcomputer 7 containing memory, the transistor 8, and the diode 13 on the locations, hardening the silver paste at 150° C. for one hour for adhesion, heating the microcomputer 7 containing memory up to 200° C. from the circuit side of the multi-layer circuit board on the heating stage, electrically connecting pats of the microcomputer 7 and the lands on the multi-layer circuit board 1 with gold wires 9 by the ultrasonic wire-bonding, dispensing a solder paste of 3.5 parts of Ag, 0.3 part of Cu, and 96.2 part of Sn by weight as a conductive material 10 to the lands on the multi-layer circuit board 1, placing parts such as resistors 11 and capacitors 12 on the multi-layer circuit board 1, printing a solder paste (solder 21) of 3.5 parts of Ag, 0.3 part of Cu, and 96.2 part of Sn by weight on the copper supporting material, placing the multi-layer circuit board on the supporting material, melting the solder (junction 5) and the conductive material 10 at 270° C. by the infrared reflow equipment, solidifying thereof to bond the supporting material 3 to the multi-layer circuit board 1 and to make electric connections between the electronic parts (resistors 11 and capacitors 12) and the multi-layer circuit board 1, electrically connecting terminals 15, the transistor 8, and the diode 13 to the multi-layer circuit board 1 with Al wires (as wire 14) at a room temperature by ultrasonic wire bonding, applying the packaging resin component 4 which contains 80% by volume of silica filler as an inorganic filling material and gels in 30 seconds at 180° C., and molding the resin material at a mold temperature of 180° C. and a transfer pressure of 7 MPa for three minutes by a low-pressure transfer-molding. The characteristics of the packaging resin material after hardening are 3 GPa (as the modulus of elasticity at a room temperature), 8 ppm/° C. (as the coefficient of line expansion), and 120° C. (as the glass transition temperature).

We tested this prepared electronic circuit device for warpage, air tightness, moldability, and mass productivity, malfunction, separation, and cracks after a thermal shock of 2000 cycles, separation, malfunction, and heat radiation after dipping in oil at 140° C. for 2000 hours. Table 1 lists the result of this test.

This electronic circuit device which was prepared above had a separation between the multi-layer circuit board and the supporting material. This is because the solder 21 was broken by the thermal stresses between the supporting material and the multi-layer circuit board.

TABLE 1(a)

| | | | a. | | | | |
|---|---|---|---|---|---|---|---|
| | | | Embodiment 1 | Embodiment 2 | Embodiment 3 | Embodiment 4 | Embodiment 5 |
| Configuration | | Summary of structure | Whole resin pack | Whole resin pack | Whole resin pack | Whole resin pack | Whole resin pack |
| | Circuit board | Material | Glass BT resin | Glass BT resin | Ceramic | Glass BT resin | Glass BT resin |
| | | Size (mm) | 50 × 40 | 50 × 40 | 50 × 40 | 50 × 40 | 50 × 40 |
| | Compound metallic material | Material quality | Silver and copper oxide (30%) | Copper and copper oxide (30%) | Copper and copper oxide (30%) | Copper and copper oxide (30%) | Copper and copper oxide (30%) |
| | | Coefficient of thermal expansion (ppm/° C.) | 14 | 13.5 | 13.5 | 13.5 | 13.5 |
| | | Thermal conductivity (W/MK) | 242 | 225 | 225 | 225 | 225 |
| | | Modulus of elasticity (GPa) | 57 | 73 | 73 | 73 | 73 |
| | | Strength od adhesion to packaging resin component | 5 | 6.4 | 6.4 | 6.4 | 6.4 |

TABLE 1(a)-continued

|  |  |  |  |  |  |  |  |
|---|---|---|---|---|---|---|---|
|  |  | (MPa) |  |  |  |  |  |
|  |  | Surface roughness (Ra) | 0.2 | 0.2 | 0.2 | 0.2 | 0.2 |
|  |  | Specific gravity | 9.1 | 7.57 | 7.57 | 7.57 | 7.57 |
|  |  | Void content | 1.0% | 6.5% | 6.5% | 6.5% | 6.5% |
|  |  | Size (mm) | 50 × 40 | 50 × 40 | 50 × 40 | 50 × 40 | 50 × 40 |
|  | Supporting material | Material quality | Aluminum | Aluminum | Aluminum | Copper | Aluminum |
|  | Junction | Circuit board and compound metallic material | Solder | Solder | Solder | Solder | Solder |
|  |  | Compound metallic material and supporting material | Welding | Welding | Welding | Welding | Welding |
|  | Packaging resin componeent | Outline of component | Epoxy resin component | Epoxy resin component | Epoxy resin component | Epoxy resin component | Epoxy resin component |
|  |  | Content od inorganic filler (% by volume) | 63 | 63 | 63 | 63 | 80 |
| Characteristics |  | Warpage | ○ | ○ | ○ | ○ | ○ |
|  |  | Air tightness | ○ | ○ | ○ | ○ | ○ |
|  |  | Moldability | ○ | ○ | ○ | ○ | ○ |
|  |  | Mass productivity | ○ | ○ | ○ | ○ | ○ |
|  | Thermal shock reliability | Separation | None | None | None | None | None |
|  |  | Crack | None | None | None | None | None |
|  |  | Malfunction | None | None | None | None | None |
|  | Oil-proof reliability | Separation | None | None | None | None | None |
|  |  | Malfunction | None | None | None | None | None |
|  |  | Heat radiation (° C.) | 10 | 12 | 8 | 7 | 12 |

|  |  |  | Embodiment 6 | Embodiment 7 | Embodiment 8 | Embodiment 9 |
|---|---|---|---|---|---|---|
| Configuration |  | Summary of structure | Whole resin pack | Whole resin pack | Whole resin pack | Whole resin pack |
|  | Circuit board | Material | Glass BT resin | Glass BT resin | Glass BT resin | Ceramic |
|  |  | Size (mm) | 50 × 40 | 50 × 40 | 50 × 40 | 50 × 40 |
|  | Compound metallic material | Material quality | Copper and copper oxide (30%) | Copper and copper oxide (30%) | Copper and copper oxide (30%) | Copper and copper oxide (30%) |
|  |  | Coefficient od thermal expansion (ppm/° C.) | 13.5 | 13.5 | 13.5 | 13.5 |
|  |  | Thermal conductivity (W/MK) | 225 | 225 | 225 | 225 |
|  |  | Modulus of elasticity (GPa) | 73 | 73 | 73 | 73 |
|  |  | Strength at adhesion to packaging resin component (MPa) | 6.4 | 6.4 | 6.4 | 6.4 |
|  |  | Surface roughness (Ra) | 0.2 | 0.2 | 0.2 | 0.2 |
|  |  | Specific gravity | 7.57 | 7.57 | 7.57 | 7.57 |
|  |  | Void content | 6.5% | 6.5% | 6.5% | 6.5% |
|  |  | Size (mm)( | 55 × 45 | 50 × 40 | 50 × 40 | 55 × 45 |
|  | Supporting material | Material quality | Aluminum | Aluminum | Aluminum | Copper |
|  | Junction | Circuit board and compound metallic material | Solder | Organic adhesive | Solder | Organic adhesive |
|  |  | Compound metallic material and supporting material | Welding | Welding | Organic adhesive | Organic adhesive |
|  | Packaging resin component | Outline of component | Epoxy resin component | Epoxy resin component | Epoxy resin component | Epoxy resin component |
|  |  | Content of inorganic filler (% by volume) | 63 | 63 | 63 | 80 |
| Characteristics |  | Warpage | ○ | ○ | ○ | ○ |
|  |  | Air tightness | ○ | ○ | ○ | ○ |
|  |  | Moldability | ○ | ○ | ○ | ○ |
|  |  | Mass productivity | ○ | ○ | ○ | ○ |
|  | Thermal shock reliability | Separation | None | None | None | None |
|  |  | Crack | None | None | None | None |
|  |  | Malfunction | None | None | None | None |
|  | Oil-proof reliability | Separation | None | None | None | None |
|  |  | Malfunction | None | None | None | None |
|  |  | Heat radiation (° C.) | 12 | 14 | 14 | 8 |

TABLE 1(b)

b.

| | | | Embodiment 10 | Embodiment 11 | Embodiment 12 | Embodiment 13 | Embodiment 14 |
|---|---|---|---|---|---|---|---|
| Configuration | | Summary of mixture | Whole resin pack | Whole resin pack | Whole resin pack | Whole resin pack | Whole resin pack |
| | Circuit board | Material | ceramics | ceramics | ceramics | ceramics | ceramics |
| | | Size (mm) | 50 × 40 | 50 × 40 | 50 × 40 | 50 × 40 | 50 × 40 |
| | Compound metallic material | Material quality | Silver and copper oxide (30%) | Copper and copper oxide (30%) | Copper and copper oxide (20%) | Copper and copper oxide (20%) | Copper and copper oxide (10%) |
| | | Coefficient of thermal exansion (ppm/° C.) | 13.5 | 13 | 13.5 | 13.5 | 18 |
| | | Thermal conductivity (W/MK) | 226 | 216 | 206 | 206 | 293 |
| | | Modulus of elasticity (GPa) | 78 | 40 | 73 | 73 | 58 |
| | | Strength of adhesion to packaging resin component (MPa) | 6.4 | 7.5 | 6.4 | — | 6 |
| | | Surface roughness (Ra) | 0.2 | 0.2 | 0.01 | 500 | 0.2 |
| | | Specific property | 6 | 4 | 7.57 | 7.57 | 8 |
| | | Void content | 1.0% | 50.0% | 6.5% | 6.5% | 6.5% |
| | | Size (mm) | 55 × 45 | 55 × 45 | 55 × 45 | 55 × 45 | 55 × 45 |
| | Supporting material | Material quality | Copper | Copper | Copper | Copper | Copper |
| | Junction | Circuit board and compound metallic material | Oragnic adhesive | Oragnic adhesive | Oragnic adhesive | Oragnic adhesive | Oragnic adhesive |
| | | Compound metallic material and supporting material | Organic adhesive | Organic adhesive | Organic adhesive | Organic adhesive | Organic adhesive |
| | Packaging resin component | Outline of component | Epoxy resin component | Epoxy resin component | Epoxy resin component | Epoxy resin component | Epoxy resin component |
| | | Content of inorganic filler (% by volume) | 80 | 80 | 80 | 80 | 80 |
| Characteristics | | Warpage | ○ | ○ | ○ | ○ | ○ |
| | | Air tightness | ○ | ○ | ○ | ○ | ○ |
| | | Reliability | ○ | ○ | ○ | ○ | ○ |
| | | Mass productivity | ○ | ○ | ○ | ○ | ○ |
| | Thermal shock relibaility | Separation | None | None | None | None | None |
| | | Crack | None | None | None | None | None |
| | | Malfunction | None | None | None | None | None |
| | Oil-proof reliability | Separation | None | None | None | None | None |
| | | Malformation | None | None | None | None | None |
| | | Heat radiation (° C.) | 8 | 8 | 8 | 8 | 7 |

| | | | Embodiment 15 | Comparative example 1 | Comparative example 2 | Comparative example 3 | Comparative example 4 |
|---|---|---|---|---|---|---|---|
| Configuration | | Summary of structure | Whole resin pack | Casing structure | Single-sided resin pack | Whole resin pack | Whole resin pack |
| | Circuit board | Material | ceramics | Ceramic | Ceramic | Ceramics | ceramics |
| | | Size (mm) | 50 × 40 | 70 × 70 | 50 × 40 | 50 × 40 | 50 × 40 |
| | Compound metallic material | Material quality | Copper and copper oxide (50%) | — | Copper and copper oxide (50%) | Zirconium | — |
| | | Coefficient of thermal expansion (ppm/° C.) | 10 | — | 13.5 | 10.5 | — |
| | | Thermal conductivity (W/MK) | 163 | — | 205 | 3 | — |
| | | Modulus of elasticity (GPa) | 50 | — | 73 | 210 | — |
| | | Strength of adhesion to packaging resin component (MPa) | — | — | 6.4 | 6 | — |
| | | Surface roughness (Ra) | 0.2 | — | 0.2 | 1 | — |
| | | Specific gravity | 7 | — | 7.57 | 6.07 | — |
| | | Void content | 6.5% | — | 6.5% | less than 1% | — |
| | | Size (mm) | 55 × 45 | — | 55 × 45 | 55 × 45 | — |
| | Supporting material | Copper | Copper | Resin casing | Copper lead frame | Copper | Copper |
| | Junction | Oragnic metallic material | Oragnic adhesive | — | Organic adhesive | Organic adhesive | Solder adhesive |
| | | Compound metallic material and supporting material | Organic adhesive | — | — | — | Organic adhesive |
| | Packaging resin component | Outline of component | Epoxy resin component | Silicone gel | Epoxy resin component | Epoxy resin component | Epocy resin component |
| | | Content of inorgaanic filler (% by volume) | 50 | 0 | 50 | 50 | 50 |
| Characteristics | | Warpage | ○ | ○ | ○ | ○ | ○ |
| | | Air tightness | ○ | Δ | — | ○ | ○ |
| | | Reliability | ○ | ○ | ○ | ○ | ○ |
| | | Mass productivity | ○ | X | ○ | ○ | ○ |

TABLE 1(b)-continued

| | | | | | | | |
|---|---|---|---|---|---|---|---|
| Thermal shock reliability | Separation | | None | None | Separated | None | Separated |
| | Crack | | None | None | None | Separated | None |
| | Malfunction | | None | None | None | Separated | Separated |
| Oil-proof reliability | Separation | | None | None | Separated | None | None |
| | Malfunction | | None | None | Separated | None | None |
| | Heat radiation (° C.) | | 8 | 20 | 5 | 17 | 11 |

Table 1 lists configurations and characteristics of Embodiments 1 to 15 and Comparative Example 1 tp 4. The configurations are Summary of structure, Materials and Sizes of multi-layer circuit boards, Quality of compound metallic materials, Coefficient of thermal expansion, Thermal conductivity, Modules of elasticity, Strength of adhesion to packaging resin component, Surface roughness, Specific gravity, Void content and size, Quality of supporting material, Junction between circuit board and compound metallic material, Junction between compound metallic material and supporting material, Type of packaging resin component, and Content of inorganic filler. The characteristics are Warpage, Air tightness, Moldability, Mass productivity, Thermal shock reliability, Oil-proof reliability, and Heat radiation.

This invention can provide a low-cost and high heat-radiating electronic circuit device featuring high compactness, little warpage, high air tightness, high moldability, high mass productivity, high reliability against thermal shocks, and high oil-proof reliability.

What is claimed is:

1. An electronic circuit device of a module structure made by packing a whole multi-layer circuit board which connects a semiconductor operating element, semiconductor memory elements, and passive elements thereon and part of a supporting material on which said multi-layer circuit board is placed into a single package by transfer-molding with a packing resin component; wherein said multi-layer circuit board and said supporting material are bonded together with a compound metallic material made up from copper oxide and at least one metal selected from a set of gold, silver, and copper.

2. An electronic circuit device of a module structure made by packing a whole multi-layer circuit board which connects a semiconductor operating element, semiconductor memory elements, and passive elements thereon and part of a supporting material on which said multi-layer circuit board is placed into a single package by transfer-molding with a packing resin component; wherein said multi-layer circuit board and said supporting material are bonded together with a compound metallic material made up from copper and copper oxide.

3. An electronic circuit device of a module structure made by packing a whole ceramic multi-layer circuit board which connects a semiconductor operating element, semiconductor memory elements, and passive elements thereon and part of a supporting material on which said ceramic multi-layer circuit board is placed into a single package by transfer-molding with a packing resin component; wherein said ceramic multi-layer circuit board and said supporting material are bonded together with a compound metallic material made up from copper and copper oxide.

4. An electronic circuit device of a module structure made by packing a whole multi-layer circuit board which connects a semiconductor operating element, semiconductor memory elements, and passive elements thereon and part of a supporting material on which said multi-layer circuit board is placed into a single package by transfer-molding with a packing resin component; wherein
    said supporting material contains copper in major proportions and
    said multi-layer circuit board and said supporting material are bonded together with a compound metallic material made up from copper and copper oxide.

5. An electronic circuit device of a module structure made by packing a whole multi-layer circuit board which connects a semiconductor operating element, semiconductor memory elements, and passive elements thereon and part of a supporting material on which said multi-layer circuit board is placed into a single package by transfer-molding with a packing resin component; wherein
    said packing resin component contains 75% or more by volume of inorganic filling material and
    said multi-layer circuit board and said supporting material are bonded together with a compound metallic material made up from copper and copper oxide.

6. An electronic circuit device of a module structure made by packing a whole multi-layer circuit board which connects a semiconductor operating element, semiconductor memory elements, and passive elements thereon and part of a supporting material on which said multi-layer circuit board is placed into a single package by transfer-molding with a packing resin component; wherein
    said supporting material contains copper in major proportions and
    said multi-layer circuit board and said supporting material are bonded together with a compound metallic material which is made up from copper and copper oxide.

7. An electronic circuit device of a module structure made by packing a whole multi-layer circuit board which connects a semiconductor operating element, semiconductor memory elements, and passive elements thereon and part of a supporting material on which said multi-layer circuit board is placed into a single package by transfer-molding with a packing resin component; wherein
    said supporting material contains copper in major proportions and
    said multi-layer circuit board and said supporting material are bonded together with a compound metallic material which is made up from copper and copper oxide using an organic adhesive to bond said multi-layer circuit board and said compound metallic material.

8. An electronic circuit device of a module structure made by packing a whole multi-layer circuit board which connects a semiconductor operating element, semiconductor memory elements, and passive elements thereon and part of a supporting material on which said multi-layer circuit board is placed into a single package by transfer-molding with a packing resin component; wherein
    said supporting material contains copper in major proportions and
    said multi-layer circuit board and said supporting material are bonded together with a compound metallic material which is made up from copper and copper oxide using an organic adhesive to bond said compound metallic material and said supporting material.

9. An electronic circuit device of a module structure made by packing a whole ceramic multi-layer circuit board which connects a semiconductor operating element, semiconductor memory elements, and passive elements thereon and part of a supporting material on which said ceramic multi-layer circuit board is placed into a single package by transfer-molding with a packing resin component; wherein
said supporting material is a metallic material containing copper in major proportions,
said packing resin component contains 75% or more by volume of inorganic filling material,
said multi-layer circuit board and said supporting material are bonded together with a compound metallic material which is made up from copper and copper oxide, and
an organic adhesive is used to bond said ceramic multi-layer circuit board to said compound metallic material and said compound metallic material to said supporting material.

10. An electronic circuit device of a module structure made by packing a whole ceramic multi-layer circuit board which connects a semiconductor operating element, semiconductor memory elements, and passive elements thereon and part of a supporting material on which said ceramic multi-layer circuit board is placed into a single package by transfer-molding with a packing resin component; wherein
said supporting material is a metallic material containing copper in major proportions,
said packing resin component contains 75% or more by volume of inorganic filling material,
said multi-layer circuit board and said supporting material are bonded together with a compound metallic material having a void content of 1 to 50% by volume which is made up from copper and copper oxide, and
an organic adhesive is used to bond said ceramic multi-layer circuit board to said compound metallic material and said compound metallic material to said supporting material.

11. An electronic circuit device of a module structure made by packing a whole ceramic multi-layer circuit board which connects a semiconductor operating element, semiconductor memory elements, and passive elements thereon and part of a supporting material on which said ceramic multi-layer circuit board is placed into a single package by transfer-molding with a packing resin component; wherein
said supporting material is a metallic material containing copper in major proportions,
said packing resin component contains 75% or more by volume of inorganic filling material,
said multi-layer circuit board and said supporting material are bonded together with a compound metallic material which is made up from copper and copper oxide,
the surface roughness (Ra) is between 0.01 and 500 μm (including both) in 40% or more of the surface area of said compound metallic material (where Ra is an arithmetic average of roughness, and
an organic adhesive is used to bond said ceramic multi-layer circuit board to said compound metallic material and said compound metallic material to said supporting material.

12. An electronic circuit device of a module structure made by packing a whole ceramic multi-layer circuit board which connects a semiconductor operating element, semiconductor memory elements, and passive elements thereon and part of a supporting material on which said ceramic multi-layer circuit board is placed into a single package by transfer-molding with a packing resin component; wherein
said supporting material is a metallic material containing copper in major proportions,
said packing resin component contains 75% or more by volume of inorganic filling material,
said multi-layer circuit board and said supporting material are bonded together with a compound metallic material which is made up from copper and copper oxide,
the ratio of copper oxide to said compound metallic material is 10% to 50% by volume, and,
an organic adhesive is used to bond said ceramic multi-layer circuit board to said compound metallic material and said compound metallic material to said supporting material.

13. An electronic circuit device of a module structure made by packing a whole ceramic multi-layer circuit board which connects a semiconductor operating element, semiconductor memory elements, and passive elements thereon and part of a supporting material on which said ceramic multi-layer circuit board is placed into a single package by transfer-molding with a packing resin component; wherein a compound metallic material which is made from copper and copper oxide is first placed between said ceramic multi-layer circuit board and said supporting material to bond thereof and then the whole multi-layer circuit board and part of said supporting material are packed into a single package by transfer-molding.

* * * * *